(12) United States Patent
Kim et al.

(10) Patent No.: US 9,941,286 B2
(45) Date of Patent: Apr. 10, 2018

(54) SEMICONDUCTOR DEVICES AND METHODS FOR MANUFACTURING THE SAME

(71) Applicant: Samsung Electronics Co., Ltd., Suwon-si, Gyeonggi-do (KR)

(72) Inventors: Jaehee Kim, Yongin-si (KR); Soonmok Ha, Hwaseong-si (KR); Jonghyuk Kim, Seoul (KR); Joonsoo Park, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/237,709

(22) Filed: Aug. 16, 2016

(65) Prior Publication Data
US 2017/0103987 A1   Apr. 13, 2017

(30) Foreign Application Priority Data
Oct. 13, 2015  (KR) ........................ 10-2015-0143020

(51) Int. Cl.
 H01L 21/8242  (2006.01)
 H01L 27/108  (2006.01)
 H01L 49/02  (2006.01)

(52) U.S. Cl.
 CPC .. *H01L 27/10894* (2013.01); *H01L 27/10814* (2013.01); *H01L 27/10826* (2013.01); *H01L 27/10852* (2013.01); *H01L 27/10855* (2013.01); *H01L 27/10879* (2013.01); *H01L 27/10885* (2013.01); *H01L 28/90* (2013.01)

(58) Field of Classification Search
 CPC ......... H01L 27/10894; H01L 27/10814; H01L 27/10826
 See application file for complete search history.

(56) References Cited

U.S. PATENT DOCUMENTS 6,461,941 B2   10/2002  Kim
6,607,983 B1 *  8/2003  Chun ................ H01L 21/02063
                                                       257/E21.019
7,101,752 B2   9/2006  Park et al.
(Continued)

FOREIGN PATENT DOCUMENTS

KR  2001-0045597 A  6/2001
KR  2001-0058967 A  7/2001
(Continued)

*Primary Examiner* — Bradley K Smith
(74) *Attorney, Agent, or Firm* — Ward and Smith, P.A.

(57) ABSTRACT

A method for manufacturing a semiconductor device includes forming first and second lower structures including selection elements on first and second chip regions of a substrate, respectively, forming first and second mold layers on the first and second lower structures, respectively, forming first and second support layers on the first and second mold layers, respectively, patterning the first support layer and the first mold layer to form first holes exposing the first lower structure, forming first lower electrodes in the first holes, forming a support pattern including at least one opening by selectively patterning the first support layer while leaving the second support layer, and removing the first mold layer through the opening. A top surface of the support pattern is disposed at a substantially same level as a top surface of the second support layer.

17 Claims, 35 Drawing Sheets

(56) References Cited

U.S. PATENT DOCUMENTS

| | | | |
|---|---|---|---|
| 7,460,211 B2 | 12/2008 | Whitefield et al. | |
| 2012/0235279 A1* | 9/2012 | Seo | H01L 27/10852 |
| | | | 257/532 |
| 2015/0104946 A1* | 4/2015 | Park | H01L 21/0337 |
| | | | 438/703 |
| 2017/0069633 A1* | 3/2017 | Kim | H01L 27/10852 |

FOREIGN PATENT DOCUMENTS

| | | |
|---|---|---|
| KR | 2001-0108772 A | 12/2001 |
| KR | 2004-0083/09 A | 10/2004 |
| KR | 2007-0071613 A | 7/2007 |
| KR | 2007-0071614 A | 7/2007 |
| KR | 2007-0071615 A | 7/2007 |
| KR | 2009-0032875 A | 4/2009 |
| KR | 101049298 B1 | 7/2011 |

\* cited by examiner

SEMICONDUCTOR DEVICES AND METHODS FOR MANUFACTURING THE SAME

CROSS-REFERENCE TO RELATED APPLICATION

This U.S. non-provisional patent application claims priority under 35 U.S.C. § 119 to Korean Patent Application No. 10-2015-0143020, filed on Oct. 13, 2015, in the Korean Intellectual Property Office, the disclosure of which is hereby incorporated by reference in its entirety.

BACKGROUND

A capacitor having a sufficient capacitance in a limited area has been demanded as a semiconductor device has been highly integrated. The capacitance of the capacitor may be proportional to a surface area of an electrode and a dielectric constant of a dielectric layer and may be inversely proportional to an equivalent oxide thickness of the dielectric layer. Thus, to increase the capacitance of the capacitor in a limited area, a three-dimensional capacitor may be formed to increase the surface area of the electrode, the equivalent oxide thickness of the dielectric layer may be reduced, and/or a dielectric layer having a high dielectric constant may be used in the capacitor.

To increase the surface area of the electrode, a height of a lower electrode (or a storage electrode) may be increased, an effective surface area of the lower electrode may be increased using a hemi-spherical grain (HSG), and/or an inner surface area and an outer surface area of one cylinder storage (OCS) electrode may be used as the surface area of the lower electrode. In addition, the dielectric layer having the high dielectric constant may include a metal oxide layer (e.g., $TiO_2$ or $Ta_2O_5$) or a ferroelectric having a perovskite structure (e.g., $PbZrTiO_3$ (PZT) or $BaSrTiO_3$ (BST)).

SUMMARY

Embodiments of the inventive concepts may provide semiconductor devices including a capacitor having a stable structure.

Embodiments of the inventive concepts may also provide methods for a semiconductor devices capable of minimizing or preventing a process defect.

In some embodiments, methods for manufacturing a semiconductor device may include forming a first lower structure and a second lower structure including selection elements on a first chip region and a second chip region of a substrate, respectively, forming a first mold layer and a second mold layer on the first lower structure and the second lower structure, respectively, forming a first support layer and a second support layer on the first mold layer and the second mold layer, respectively, patterning the first support layer and the first mold layer to form a plurality of first holes exposing the first lower structure, forming first lower electrodes in the first holes, respectively, forming a support pattern including at least one opening by selectively patterning the first support layer while leaving the second support layer, and removing the first mold layer through the at least one opening. A top surface of the support pattern may be disposed at a substantially same level as a top surface of the second support layer.

In some embodiments, the second chip region may be disposed on an edge of the substrate.

In some embodiments, the method may further include forming a recess region in the second mold layer when the first mold layer is removed.

In some embodiments, the methods may further include forming a dielectric layer covering surfaces of the first lower electrodes and a top surface of the second support layer, and forming an upper electrode on the dielectric layer.

In some embodiments, the dielectric layer and the upper electrode may be sequentially formed in the recess region to fill the recess region.

In some embodiments, the forming of the support pattern may include forming a first mask pattern and a second mask pattern on the first support layer and the second support layer, respectively, the second mask pattern completely covering a top surface of the second support layer, and patterning the first support layer using the first mask pattern as an etch mask. The second support layer may be protected by the second mask pattern when the first support layer is patterned.

In some embodiments, the first and second mold layers may be formed at the same time, and the first and second support layers may be formed at the same time.

In some embodiments, the methods may further include patterning the second support layer and the second mold layer to form a plurality of second holes on the second chip region, and forming second lower electrodes in the second holes, respectively. The second holes may be formed simultaneously with the first holes, and the second lower electrodes may be formed simultaneously with the first lower electrodes.

In some embodiments, a bottom surface of at least one of the second holes may be vertically spaced apart from a top end of the second lower structure.

In some embodiments, the forming of each of the first and second lower structures may include forming a device isolation layer in the substrate to define an active region, forming a gate line intersecting the active region, and forming a first dopant region and a second dopant region in the active region at both sides of the gate line, respectively.

In some embodiments, the forming of each of the first and second lower structures may further include forming a bit line electrically connected to the first dopant region. The bit line may intersect the gate line when viewed from a plan view.

In some embodiments, the forming of each of the first and second lower structures may further include forming a buried contact electrically connected to the second dopant region, and forming a landing pad on the buried contact. At least one of the first holes may expose the landing pad.

In some embodiments, methods for manufacturing a semiconductor device may include forming transistors on each of a first chip region and a second chip region of a substrate, forming a first mold layer and a second mold layer on the first chip region and the second chip region, respectively, forming a first support layer and a second support layer on the first mold layer and the second mold layer, respectively, forming first lower electrodes that penetrate the first support layer and the first mold layer so as to be electrically connected to the transistors of the first chip region, and selectively removing the first mold layer while leaving the second mold layer. A recess region may be formed in the second mold layer when the first mold layer is removed.

In some embodiments, the second chip region may be disposed on an edge of the substrate.

In some embodiments, the methods may further include forming a support pattern including at least one opening by selectively patterning the first support layer while leaving the second support layer. A top surface of the support pattern may be disposed at a substantially same level as a top surface of the second support layer, and the first mold layer may be isotropically removed by an etching solution provided through the at least one opening.

In some embodiments, semiconductor devices may include a substrate including a first chip region and a second chip region, first capacitors including first lower electrodes two-dimensionally arranged on the first chip region, a first dielectric layer covering surfaces of the first lower electrodes, and a first upper electrode on the first dielectric layer, an upper support pattern coupled to sidewalls of the first lower electrodes and including at least one opening, a lower mold layer disposed on the second chip region and including a first recess region, and an upper support layer on the lower mold layer. A top surface of the upper support pattern may be disposed at a substantially same level as a top surface of the upper support layer.

In some embodiments, the second chip region may be disposed on an edge of the substrate.

In some embodiments, the semiconductor devices may further include a second dielectric layer and a second upper electrode on the second chip region. The second dielectric layer and the second upper electrode may be sequentially disposed in the first recess region to fill the first recess region.

In some embodiments, the semiconductor devices may further include a lower support pattern disposed under the upper support pattern and coupled to the sidewalls of the first lower electrodes, and a lower support layer and an upper mold layer sequentially stacked between the lower mold layer and the upper support layer. A top surface of the lower support pattern may be disposed at a substantially same level as a top surface of the lower support layer.

In some embodiments, the semiconductor devices may further include a second dielectric layer and a second upper electrode on the second chip region. The upper mold layer may include a second recess region, and the second dielectric layer and the second upper electrode may be sequentially disposed in each of the first and second recess regions to fill each of the first and second recess regions.

In some embodiments, the upper support pattern may overlap with the lower support pattern when viewed from a plan view.

In some embodiments, the semiconductor devices may further include second capacitors including second lower electrodes penetrating the lower mold layer and two-dimensionally arranged, a second dielectric layer covering surfaces of the second lower electrodes, and a second upper electrode on the second dielectric layer.

In some embodiments, a bottom surface of at least one of the second lower electrodes may be vertically spaced apart from a bottom surface of the lower mold layer.

In some embodiments, the semiconductor devices may further include a lower structure disposed on the first chip region and electrically connected to the first lower electrodes. The lower structure may include a device isolation layer defining an active region of the substrate, a gate line intersecting the active region, and a first dopant region and a second dopant region disposed in the active region at both sides of the gate line, respectively.

In some embodiments, the lower structure may further include a bit line electrically connected to the first dopant region. The bit line may intersect the gate line when viewed from a plan view.

In some embodiments, the lower structure may further include a buried contact electrically connected to the second dopant region, and a landing pad on the buried contact. At least one of the first lower electrodes may be in contact with the landing pad.

Some embodiments of the present inventive concept are directed to methods for manufacturing a semiconductor device. Such methods may include forming, sequentially, a first mold layer and a first support layer on a first lower structure in a first chip region of a substrate, the first mold layer and the first support layer including a plurality of holes exposing the first structure, forming a second mold layer on a second lower structure in a second chip region of the substrate, forming first lower electrodes in the first holes, respectively, forming a support pattern including at least one opening by selectively patterning a first support layer, and removing the first mold layer through the at least one opening.

Some embodiments include forming a second support layer on the second mold layer. In some embodiments, a top surface of the support pattern is at substantially a same level as a top surface of the second support layer.

Some embodiments provide that the first and second lower structures include selection elements and the second chip region is on an edge of the substrate.

Some embodiments further include forming a recess region in the second mold layer when the first mold layer is removed, forming a dielectric layer that covers surfaces of the first lower electrodes, and forming an upper electrode on the dielectric layer. In some embodiments, the dielectric layer and the upper electrode are sequentially formed in the recess region to fill the recess region.

Some embodiments include forming each of the first and second lower structures. In some embodiments, forming each of the first and second lower structures comprises forming a device isolation layer in the substrate to define an active region, forming a gate line intersecting the active region, and forming a first dopant region and a second dopant region in the active region at both sides of the gate line, respectively.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
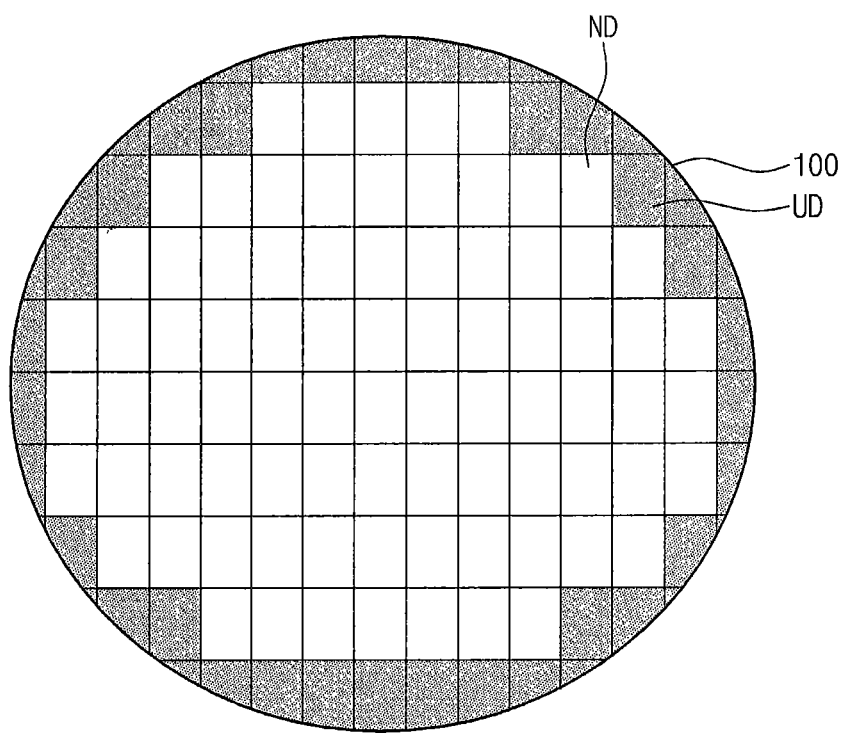
FIG. 1 is a plan view illustrating a wafer on which semiconductor devices according to some embodiments of the inventive concepts are formed.

The inventive concepts will now be described more fully hereinafter with reference to the accompanying drawings, in which example embodiments of the inventive concepts are shown. The inventive concepts and methods of achieving them will be apparent from the following example embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes.

Example embodiments of aspects of the present inventive concepts explained and illustrated herein include their complementary counterparts. The same reference numerals or the same reference designators denote the same elements throughout the specification.

Figure 2A:
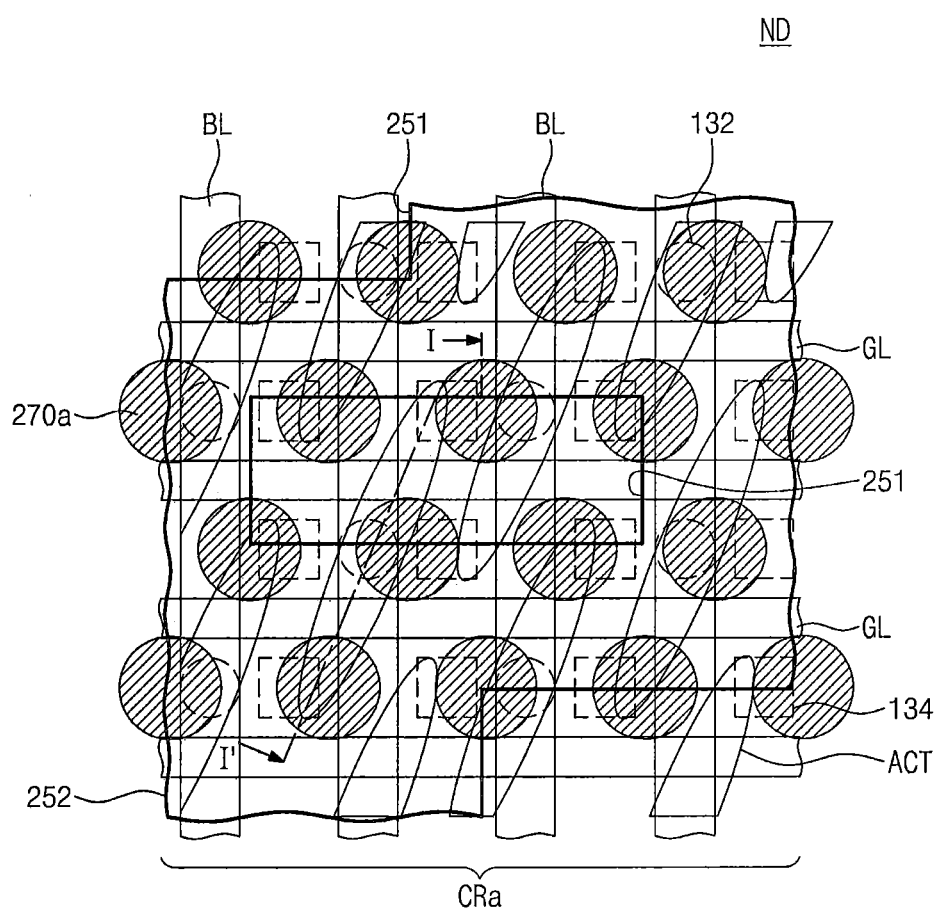
FIG. 2A is a plan view illustrating a semiconductor device on a first chip region according to some embodiments of the inventive concepts.
Figure 2B:
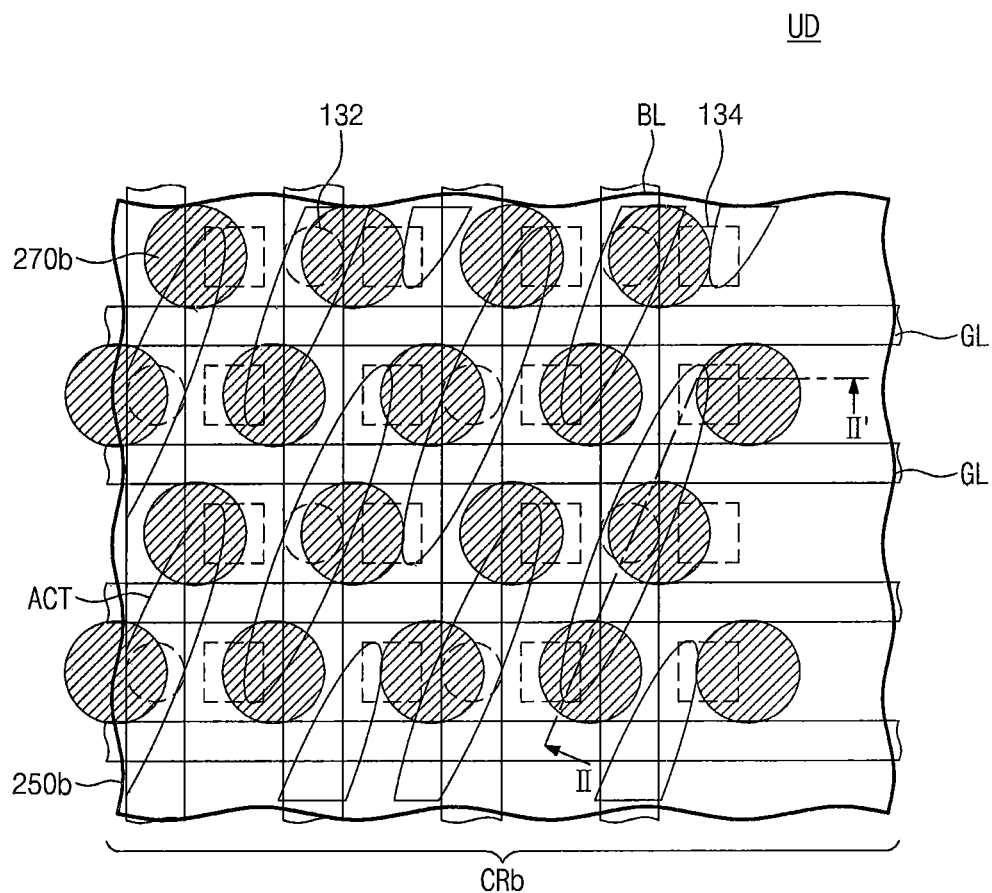
FIG. 2B is a plan view illustrating a semiconductor device on a second chip region according to some embodiments of the inventive concepts.
Figure 2B:
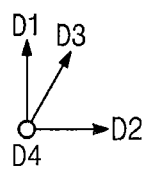
Figure 3A:
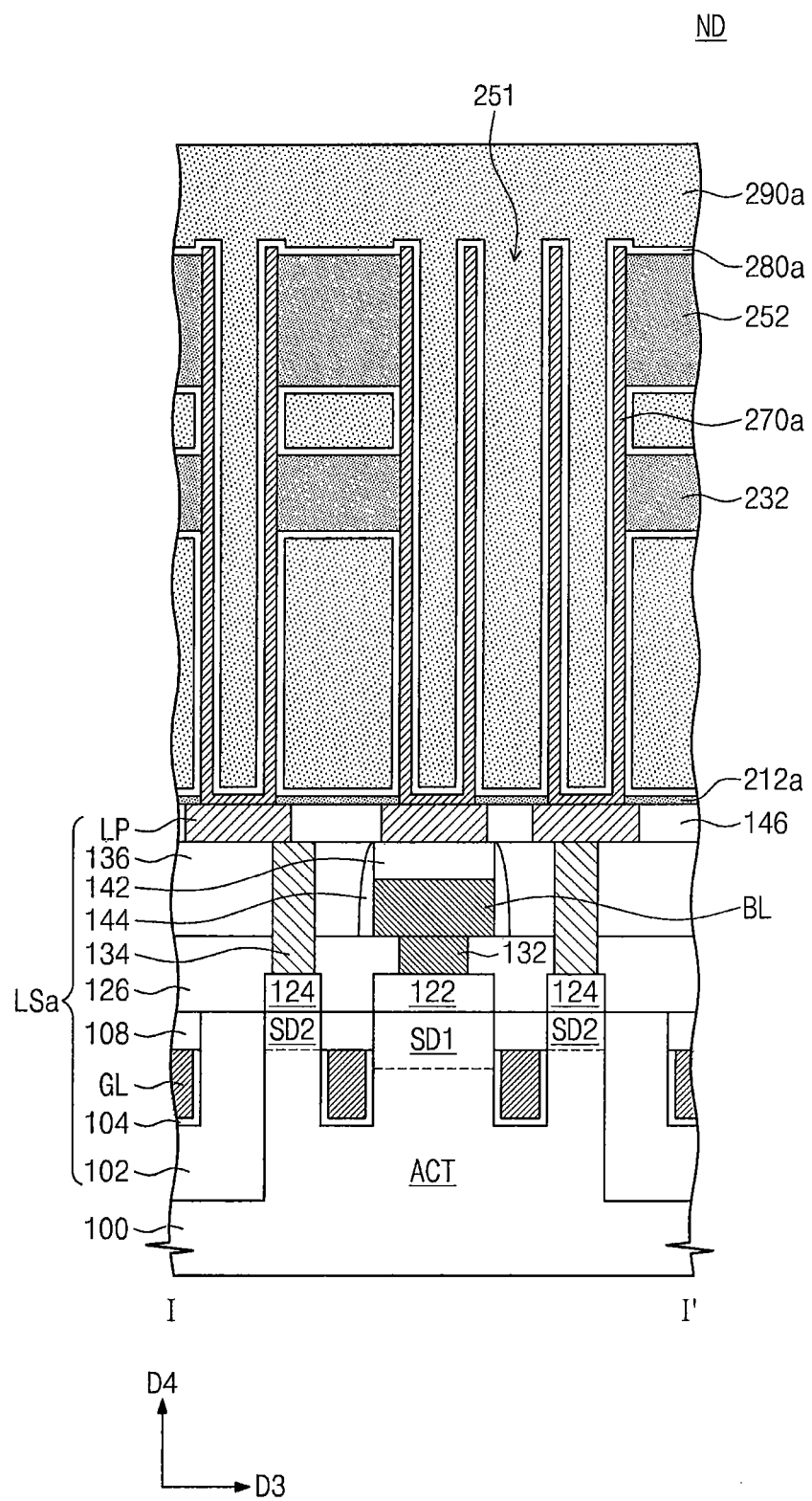
FIG. 3A is a cross-sectional view taken along a line I-I' of FIG. 2A.
Figure 3B:
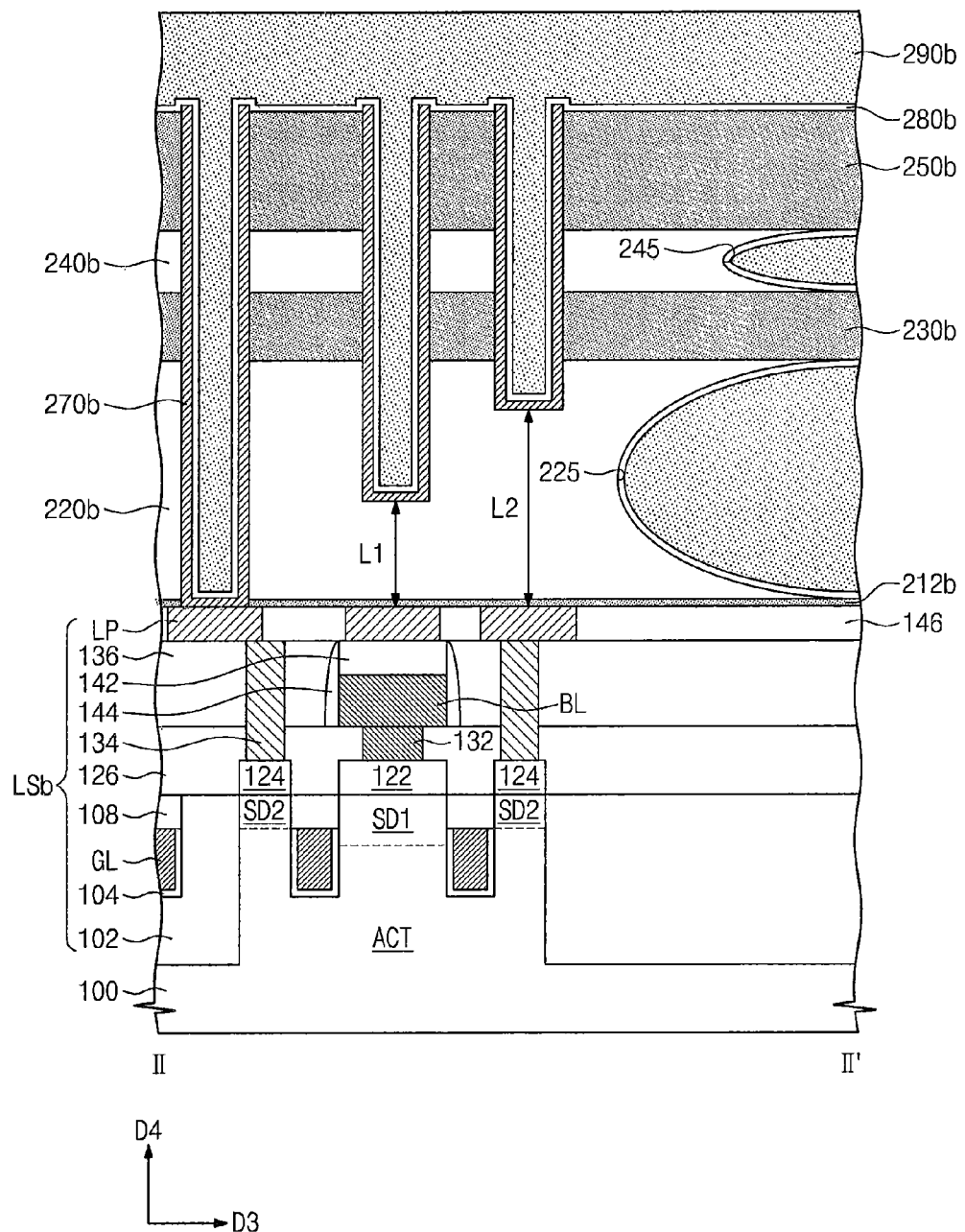
FIG. 3B is a cross-sectional view taken along a line II-II' of FIG. 2B.

FIG. 1 is a plan view illustrating a wafer on which semiconductor devices according to some embodiments of the inventive concepts are formed. FIG. 2A is a plan view illustrating a semiconductor device on a first chip region according to some embodiments of the inventive concepts. FIG. 2B is a plan view illustrating a semiconductor device on a second chip region according to some embodiments of the inventive concepts. FIG. 3A is a cross-sectional view taken along a line I-I' of FIG. 2A. FIG. 3B is a cross-sectional view taken along a line II-II' of FIG. 2B.

Referring to FIGS. 1, 2A, 2B, 3A, and 3B, a substrate 100 including first chip regions ND and second chip regions UD may be provided. The substrate 100 may be a silicon substrate, a germanium substrate, and/or a silicon-germanium substrate. For example, the substrate 100 illustrated in FIG. 1 may be a silicon wafer.

The second chip regions UD may be disposed on an edge of the substrate 100. The second chip regions UP may be regions on which semiconductor devices may be incompletely formed. Thus, the second chip regions UD may be removed by a subsequent cutting process. On the other hand, the first chip regions ND may be surrounded by the second chip regions UD. The first chip regions ND may be regions on which semiconductor devices may be availably formed. Thus, the first chip regions ND may be formed into semiconductor chips by the subsequent cutting process.

A first cell region CRa may be provided on one of the first chip regions ND, and a second cell region CRb may be provided on one of the second chip regions UD. Hereinafter, the first cell region CRa will be mainly described.

Referring again to FIGS. 2A and 3A, a first lower structure LSa may be disposed on the substrate 100. The first lower structure LSa may include transistors used as selection elements. The first lower structure LSa will be described in detail hereinafter.

A device isolation layer 102 may be provided in the substrate 100 to define active regions ACT. For example, the device isolation layer 102 may include at least one of a silicon oxide layer, a silicon nitride layer, and/or a silicon oxynitride layer. Each of the active regions ACT may have a bar shape and may have a long axis in a third direction D3 when viewed from a plan view. The third direction D3 may intersect first and second directions D1 and D2. The first, second, and third directions D1, D2, and D3 may be parallel to a top surface of the substrate 100, and the second direction D2 may intersect the first direction D1.

Gate lines GL may be provided in the substrate 100 to intersect the active regions ACT. The gate lines GL may extend in the second direction D2 and may be arranged along the first direction D1. The gate lines GL may be buried in the substrate 100. The gate lines GL may include a conductive material. For example, the gate lines GL may include at least one of a doped semiconductor material (e.g., doped silicon or doped germanium), a conductive metal nitride (e.g., titanium nitride or tantalum nitride), a metal (e.g., tungsten, titanium, or tantalum), and/or a metal-semiconductor compound (e.g., tungsten silicide, cobalt silicide, or titanium silicide).

A gate insulating pattern 104 may be disposed between each of the gate lines GL and the active regions ACT and between each of the gate lines GL and the device isolation layer 102. For example, the gate insulating patterns 104 may include at least one of silicon oxide, silicon nitride, or silicon oxynitride.

First capping patterns 108 may be provided on top surfaces of the gate lines GL, respectively. Top surfaces of the first capping patterns 108 may be substantially coplanar with the top surface of the substrate 100. For example, the first capping patterns 108 may include at least one of silicon oxide, silicon nitride, and/or silicon oxynitride. In some embodiments, a bottom surface of each of the first capping patterns 108 may be in contact with a top surface of each of the gate insulating patterns 104, and both sidewalls of each of the first capping patterns 108 may be in contact with the active region ACT and/or the device isolation layer 102. In certain embodiments, the gate insulating pattern 104 may extend between the first capping pattern 108 and the active region ACT and/or between the first capping pattern 108 and the device isolation layer 102. In this case, the first capping patterns 108 may include silicon nitride, and the gate insulating patterns 104 may include silicon oxide. Here, the gate insulating pattern 104 between the first capping pattern 108 and the active region ACT may function as a buffer relaxing between the first capping pattern 108 and the active region ACT.

A first dopant region SD1 and second dopant regions SD2 may be provided in each of the active regions ACT. In each of the active regions ACT, the second dopant regions SD2 may be spaced apart from each other with the first dopant region SD1 interposed therebetween. The first dopant region SD1 may be disposed in the active region ACT between a pair of gate lines GL adjacent one another. The second dopant regions SD2 may be disposed in the active region ACT at both sides of the pair of gate lines GL, respectively. In other words, the second dopant regions SD2 may be spaced apart from each other with the pair of gate lines GL interposed therebetween. The first dopant region SD1 may be deeper than the second dopant regions SD2 in the substrate 100. The first dopant region SD1 may have the same conductivity type as the second dopant regions SD2.

A first pad 122 and second pads 124 may be disposed on the substrate 100. The first pad 122 may be connected to the first dopant region SD1, and the second pads 124 may be connected to the second dopant regions SD2, respectively. The first pad 122 and the second pads 124 may include a conductive material, e.g., poly-crystalline silicon doped with dopants and/or single-crystalline silicon doped with dopants. A first interlayer insulating layer 126 may be provided on the substrate 100 to cover the first pad 122 and the second pads 124. The first interlayer insulating layer 126 may include at least one of a silicon oxide layer, a silicon nitride layer, or a silicon oxynitride layer.

Bit lines BL may be provided on the first interlayer insulating layer 126. The bit lines BL may extend in the first direction D1 and may be arranged along the second direction D2. Each of the bit lines BL may be electrically connected to the first dopant region SD1 through a bit line contact 132. The bit line contact 132 may penetrate the first interlayer insulating layer 126 so as to be connected to the first pad 122. For example, the bit lines BL may include at least one of a doped semiconductor material (e.g., doped silicon or doped germanium), a conductive metal nitride (e.g., titanium nitride or tantalum nitride), a metal (e.g., tungsten, titanium, or tantalum), and/or a metal-semiconductor compound (e.g., tungsten silicide, cobalt silicide, or titanium silicide). The bit line contacts 132 may include the same material as the bit lines BL.

Second capping patterns 142 may be provided on top surfaces of the bit lines BL, respectively. For example, the second capping patterns 142 may include at least one of silicon nitride, silicon oxide, and/or silicon oxynitride. Bit line spacers 144 may be provided on both sidewalls of each of the bit lines BL. For example, the bit line spacers 144 may include at least one of silicon nitride, silicon oxide, or silicon oxynitride. A second interlayer insulating layer 136 may be provided on the first interlayer insulating layer 126 to cover the bit lines BL, the second capping patterns 142, and the bit line spacers 144. The second interlayer insulating layer 136 may include, for example, a silicon oxide layer. In addition, buried contacts 134 may penetrate the second and first interlayer insulating layers 136 and 126 so as to be connected to the second pads 124, respectively. The buried contacts 134 may include a conductive material such as doped silicon and/or a metal.

Landing pads LP may be provided on the second interlayer insulating layer 136 so as to be connected to the buried contacts 134, respectively. The landing pads LP may be two-dimensionally arranged on the second interlayer insulating layer 136. A size of the landing pad LP may be greater than that of the buried contact 134 when viewed from a plan view. The landing pads LP may partially overlap with the buried contacts 134, respectively, when viewed from a plan view. However, the two-dimensional arrangement of the landing pads LP may not coincide with the two-dimensional arrangement of the buried contacts 134.

The landing pads LP may include a conductive material. For example, the landing pads LP may include at least one of a doped semiconductor material (e.g., doped silicon or doped germanium), a conductive metal nitride (e.g., titanium nitride or tantalum nitride), a metal (e.g., tungsten, titanium, or tantalum), and/or a metal-semiconductor compound (e.g., tungsten silicide, cobalt silicide, or titanium silicide).

An insulating pattern 146 may be disposed on the second interlayer insulating layer 136 to fill a space between the landing pads LP. The insulating pattern 146 may include at least one of silicon oxide, silicon nitride, and/or silicon oxynitride.

A first etch stop pattern 212a may be disposed on the landing pads LP. First lower electrodes 270a of capacitors may be disposed on the landing pads LP, respectively. The first lower electrodes 270a may penetrate the first etch stop pattern 212a so as to be in contact with the landing pads LP, respectively. The capacitors may include the first lower electrodes 270a, a first dielectric layer 280a, and a first upper electrode 290a. The first lower electrodes 270a may be electrically connected to the selection elements (e.g., the transistors) of the first lower structure LSa. In some embodiments, the first lower electrodes 270a may be electrically connected to the second dopant regions SD2 through the landing pads LP and the buried contacts 134, respectively.

As illustrated in FIG. 2A, the first lower electrodes 270a may be two-dimensionally arranged along the first direction D1 and the second direction D2 when viewed from a plan view. The arrangement of the first lower electrodes 270a may correspond to the arrangement of the landing pads LP. In some embodiments, the first lower electrodes 270a constituting two columns adjacent one another may be arranged in a zigzag form along the first direction D1.

Each of the first lower electrodes 270a may have a cylindrical shape that has a bottom portion and a sidewall portion vertically extending from an edge of the bottom portion. The bottom portion and the sidewall portion of the first lower electrode 270a may have substantially the same thickness. In certain embodiments, even though not shown in the drawings, the first lower electrode 270a may have a pillar shape. Top surfaces of the first lower electrodes 270a may be substantially coplanar with each other. Planar diameters of the first lower electrodes 270a may be substantially equal to each other.

The first lower electrodes 270a may include at least one of a metal material, a metal nitride, a metal silicide, a conductive noble metal oxide, or a conductive oxide. For example, the first lower electrodes 270a may include at least one of a high melting point metal (e.g., cobalt, titanium, nickel, tungsten, or molybdenum), a metal nitride (e.g., titanium nitride (TiN), titanium-silicon nitride (TiSiN), titanium-aluminum nitride (TiAlN), tantalum nitride (TaN), tantalum-silicon nitride (TaSiN), tantalum-aluminum nitride (TaAlN), and/or tungsten nitride (WN)), a noble metal (e.g., platinum (Pt), ruthenium (Ru), or iridium (Ir)), a conductive noble metal oxide (e.g., PtO, $RuO_2$, or $IrO_2$), and/or a conductive oxide (e.g., $SrRuO_3$ (SRO), $(Ba,Sr)RuO_3$ (BSRO), $CaRuO_3$ (CRO), or LSCo).

Since a capacitance of the capacitor is proportional to a surface area of the first lower electrode 270a, a height of the first lower electrode 270a may be increased to increase the surface area of the first lower electrode 270a in a limited area. Thus, an aspect ratio (e.g., a ratio of a height to a width) of the first lower electrode 270a may increase as the capacitance of the capacitor increases. To prevent warpage or leaning of the first lower electrodes 270a having a great height, lower and upper support patterns 232 and 252 may be provided to laterally support the first lower electrodes 270a. Each of the lower and upper support patterns 232 and 252 may be coupled to portions of sidewalls of the first lower electrodes 270a. The lower and upper support patterns 232 and 252 may be disposed at levels different from each other. Meanwhile, vertical heights of the lower and upper support patterns 232 and 252 may be variously adjusted. In some embodiments of the inventive concepts, two support patterns supporting the first lower electrodes 270a are illustrated as an example. In certain embodiments, three or more support patterns may be provided as the aspect ratio of the first lower electrode 270a increases.

The lower support pattern 232 may be connected to lower portions of the sidewalls of the first lower electrodes 270a and may have lower openings. The upper support pattern 252 may be connected to upper portions of the sidewalls of the first lower electrodes 270a and may have upper openings 251. The lower openings and the upper openings 251 may have bar shapes, rectangular shapes, or linear shapers when viewed from a plan view.

In some embodiments, the upper openings 251 may substantially overlap with the lower openings when viewed from a plan view. In other words, the lower and upper support patterns 232 and 252 may substantially overlap with each other when viewed from a plan view. The minimum width of the lower openings may be greater than a distance between the first lower electrodes 270a, and the minimum width of the upper openings 251 may also be greater than the distance between the first lower electrodes 270a.

A thickness of the lower support pattern 232 may be different from that of the upper support pattern 252. For example, the lower support pattern 232 may be thinner than the upper support pattern 252. In certain embodiments, the thickness of the lower support pattern 232 may be substantially equal to that of the upper support pattern 252. In some embodiments, the thickness of the lower support pattern 232 may range from about 100 Å to about 500 Å, and the thickness of the upper support pattern 252 may range from about 300 Å to about 1500 Å. The lower and upper support patterns 232 and 252 may include at least one of SiN, SiCN, TaO, and/or $TiO_2$.

The first dielectric layer 280a with a substantially uniform thickness may be provided on the surfaces of a plurality of first lower electrodes 270a. In addition, the first dielectric layer 280a with the substantially uniform thickness may also be provided on surfaces of the lower and upper support patterns 232 and 252. In some embodiments, the first dielectric layer 280a may include a single layer or multilayer including at least one of a metal oxide (e.g., $HfO_2$, $ZrO_2$, $Al_2O_3$, $La_2O_3$, $Ta_2O_3$, or $TiO_2$) and/or a dielectric material having a perovskite structure (e.g., $SrTiO_3$ (STO), $(Ba,Sr)TiO_3$ (BST), $BaTiO_3$, PZT, or PLZT). A thickness of the first dielectric layer 280a may range from about 50 Å to about 150 Å.

The first upper electrode 290a may be provided on the first dielectric layer 280a to cover the plurality of first lower electrodes 270a. In addition, the first upper electrode 290a may fill inner spaces of the first lower electrodes 270a having the cylindrical shapes. The first upper electrode 290a may include at least one of silicon doped with dopants, a metal material, a metal nitride, a conductive noble metal oxide, a conductive oxide, and/or a metal silicide. For example, the first upper electrode 290a may include at least one of a high melting point metal (e.g., cobalt, titanium, nickel, tungsten, or molybdenum), a metal nitride (e.g., titanium nitride (TiN), titanium-silicon nitride (TiSiN), titanium-aluminum nitride (TiAlN), tantalum nitride (TaN), tantalum-silicon nitride (TaSiN), tantalum-aluminum nitride (TaAlN), or tungsten nitride (WN)), a noble metal (e.g., platinum (Pt), ruthenium (Ru), or iridium (Ir)), a conductive noble metal oxide (e.g., PtO, $RuO_2$, or $IrO_2$), and/or a conductive oxide (e.g., $SrRuO_3$ (SRO), $(Ba,Sr)RuO_3$ (BSRO), $CaRuO_3$ (CRO), or LSCo).

Hereinafter, the second cell region CRb of the second chip region UD will be mainly described. Referring to FIGS. 2B and 3B, a second lower structure LSb may be disposed on the substrate 100. The second lower structure LSb may include transistors corresponding to selection elements and may be the same as the first lower structure LSa described above with reference to FIGS. 2A and 3A.

A second etch stop pattern 212b and second lower electrodes 270b may be disposed on the second lower structure LSb. Structures, arrangement, and materials of the second lower electrodes 270b may be the same as those of the first lower electrodes 270a described above. However, at least one of the second lower electrodes 270b may be vertically spaced apart from landing pads LP of the second lower structure LSb. For example, one of the second lower electrodes 270b may be vertically spaced apart from a corresponding one of the landing pads LP by a first length L1, and another of the second lower electrodes 270b may be vertically spaced apart from a corresponding one of the landing pads LP by a second length L2. The lengths L1 and L2 may be different from each other. For example, the lengths L1 and L2 may sequentially increase as a lateral distance from a center of the second cell region CRb increases. In other words, the lengths L1 and L2 may sequentially increase as a distance from recess regions 225 and 245 to be described later decreases.

A second lower support layer 230b and a second upper support layer 250b may be provided to laterally support the second lower electrodes 270b. The second lower support layer 230b may be disposed at substantially the same level as the lower support pattern 232 described above, and the second upper support layer 250b may be disposed at substantially the same level as the upper support pattern 252 described above. In particular, a height (or a level) of a top surface of the second upper support layer 250b may be substantially the same as that of a top surface of the upper support pattern 252.

The second lower and upper support layers 230b and 250b may not have openings, unlike the lower and upper support patterns 232 and 252. In other words, the second lower electrodes 270b may simply penetrate the second upper and lower support layers 250b and 230b widely spread in a plan view.

A second lower mold layer 220b may be disposed between the second lower structure LSb and the second lower support layer 230b, and a second upper mold layer 240b may be disposed between the second lower support layer 230b and the second upper support layer 250b. The second lower and upper mold layers 220b and 240b may surround outer sidewalls of the second lower electrodes 270b. The second lower and upper mold layers 220b and 240b may include at least one of a silicon oxide layer, a crystalline silicon layer, an amorphous silicon layer, a doped silicon layer, a silicon-germanium layer, and/or a carbon-based material layer.

In some embodiments, process defects occurring on the second chip region UD of the edge of the wafer may be more than process defects occurring on the first chip region ND. Thus, when the second lower electrodes 270b are formed on the second chip region UD, the second lower electrodes 270b may not be normally fixed but may be leaned or be moved to another region, thereby causing defects on the first chip region ND adjacent the second chip region LJD. However, according to some embodiments of the inventive concepts, the second lower electrodes 270b may be fixed by the second lower and upper support layers 230b and 250b and the second lower and upper mold layers 220b and 240b, thereby preventing these defects.

The second lower mold layer 220b may include a lower recess region 225, and the second upper mold layer 240b may include an upper recess region 245. The lower and upper recess regions 225 and 245 may have shapes that are laterally recessed toward the center of the second cell region CRb. A thickness of the second lower mold layer 220b may be greater than that of the second upper mold layer 240b, and thus a lateral recessed depth of the lower recess region 225 may be greater than that of the upper recess region 245.

A second dielectric layer 280b may be provided on inner sidewalls of a plurality of second lower electrodes 270b and may have a substantially uniform thickness. In addition, the second dielectric layer 280b may cover the top surface of the second upper support layer 250b. The second dielectric layer 280b may include the same material as the first dielectric layer 280a. A second upper electrode 290b may be provided on the second dielectric layer 280b to cover the inner sidewalls of the plurality of second lower electrodes 270b. The second upper electrode 290b may include the same material as the first upper electrodes 290a.

The second dielectric layer 280b and the second upper electrode 290b may be sequentially disposed in each of the lower and upper recess regions 225 and 245 to fill each of the lower and upper recess regions 225 and 245.

Figure 12A:
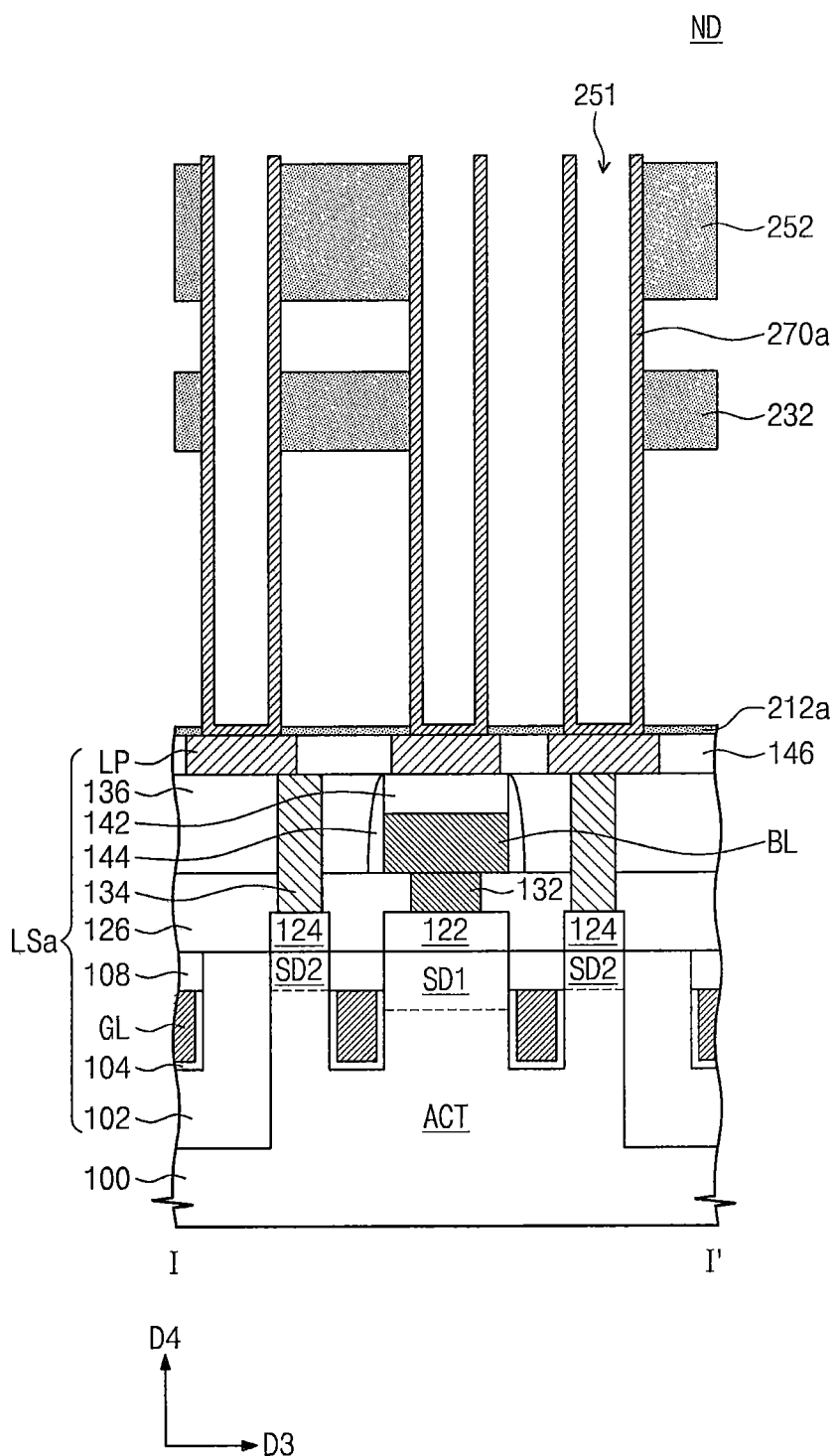
FIG. 12A is a cross-sectional view corresponding to the line I-I' of FIG. 2A.
Figure 12B:
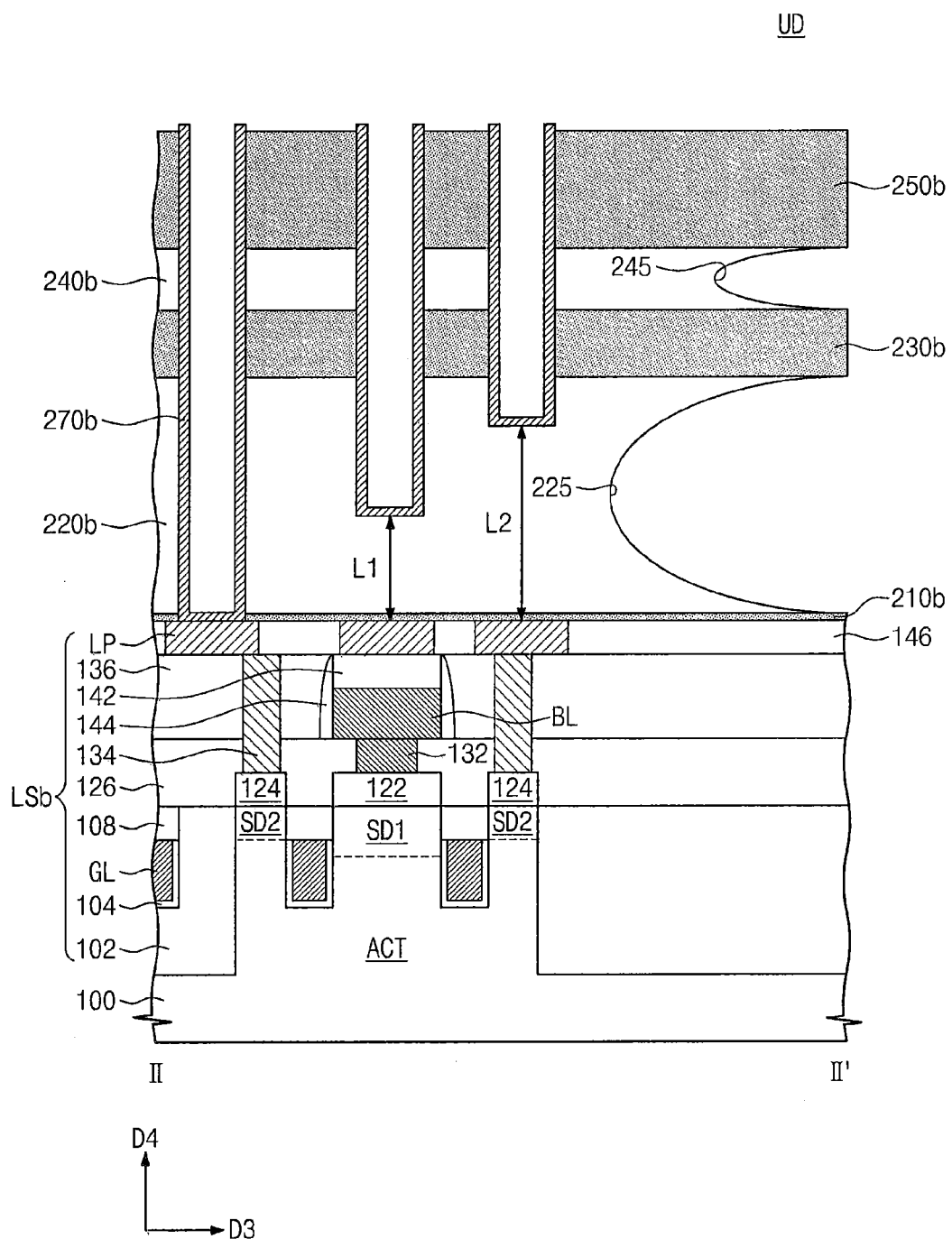
FIG. 12B is a cross-sectional view corresponding to the line II-II' of FIG. 2B.

FIGS. 4A, 6A, 8A, and 10A are plan views illustrating methods for manufacturing a semiconductor device on a first chip region ND, according to some embodiments of the inventive concepts. FIGS. 4B, 6B, 8B, and 10B are plan views illustrating methods for manufacturing a semiconductor device on a second chip region UD, according to some embodiments of the inventive concepts. FIGS. 5A, 7A, 9A, and 11A are cross-sectional views taken along lines I-I' of 4A, 6A, 8A, and 10A, respectively. FIG. 12A is a cross-sectional view corresponding to the line I-I' of FIG. 2A. FIGS. 5B, 7B, 9B, and 11B are cross-sectional views taken along lines II-II' of 4B, 6B, 8B, and 10B, respectively. FIG. 12B is a cross-sectional view corresponding to the line II-II' of FIG. 2B.

Referring to FIGS. 4A, 4B, 5A, and 5B, a substrate 100 including first chip regions ND and second chip regions UD may be provided. A first cell region CRa may be provided on any one of the first chip regions ND, and a second cell region CRb may be provided on any one of the second chip regions UD. First, the first cell region CRa will be mainly described hereinafter.

Figure 4A:
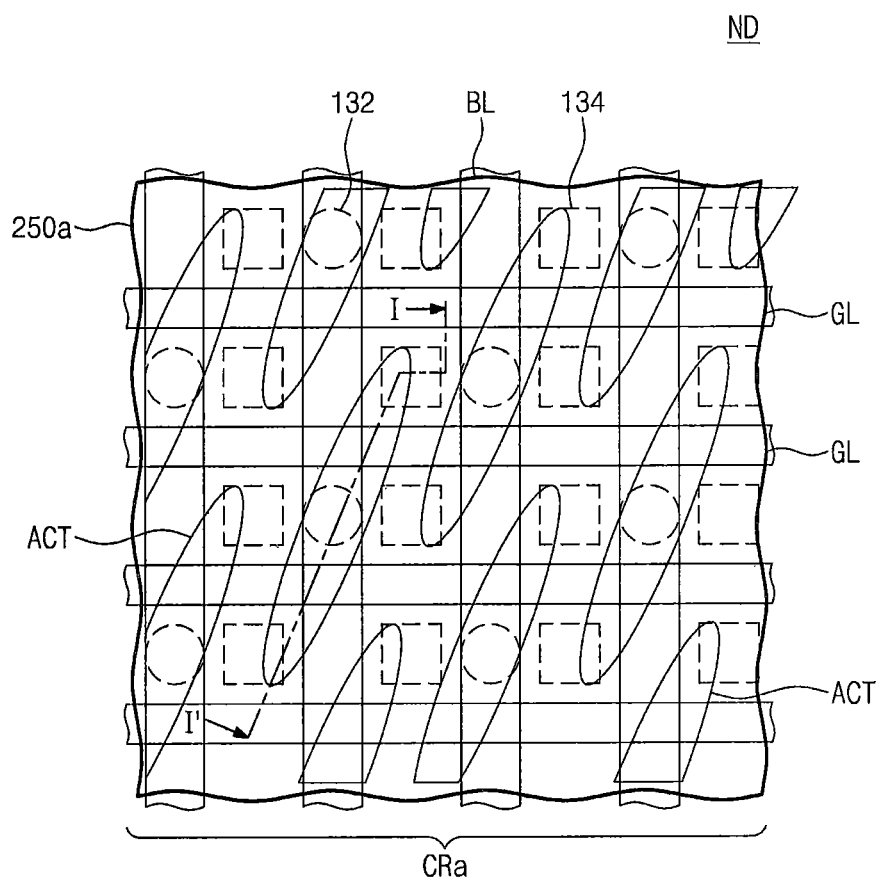
FIGS. 4A, 6A, 8A, and 10A are plan views illustrating methods for manufacturing a semiconductor device on a first chip region, according to some embodiments of the inventive concepts.
Figure 5A:
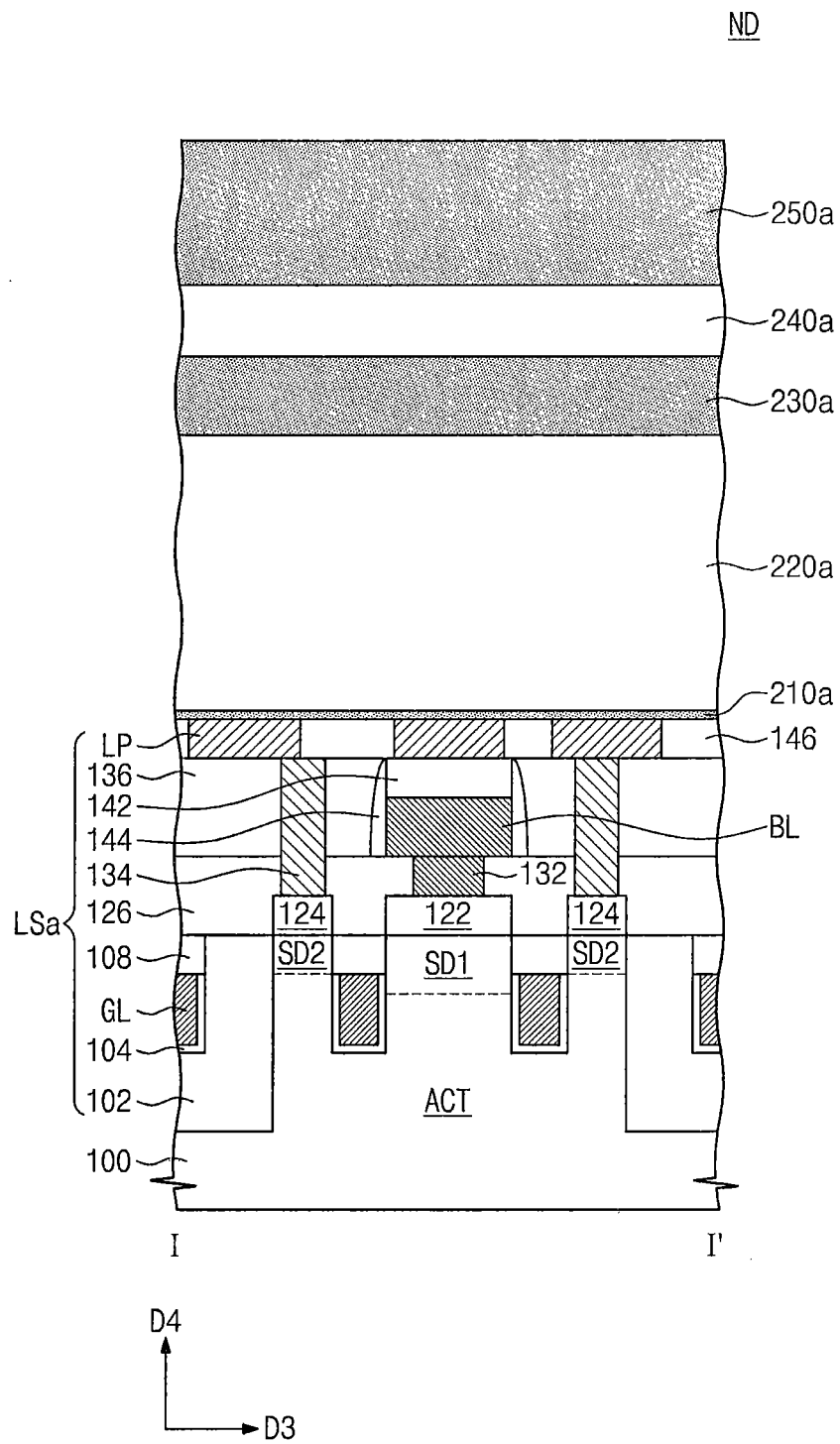
FIGS. 5A, 7A, 9A, and 11A are cross-sectional views taken along lines I-I' of 4A, 6A, 8A, and 10A, respectively.

Referring to FIGS. 4A and 5A, a first lower structure LSa may be formed on the substrate 100. In detail, a device isolation layer 102 may be formed in the substrate 100 to define active regions ACT in the first cell region CRa. In some embodiments, the device isolation layer 102 may be formed using a shallow-trench isolation (STI) technique. The device isolation layer 102 may be formed of at least one of a silicon nitride layer, a silicon oxide layer, and/or a silicon oxynitride layer.

Gate lines GL intersecting the active regions ACT may be formed in the substrate 10Q. Gate insulating patterns 104 may be formed between the gate lines GL and the active regions ACT and between the device isolation layer 102 and the gate lines GL. First capping patterns 108 may be formed on top surfaces of the gate lines GL, respectively. Forming the gate lines GL and the gate insulating patterns 104 may include patterning the substrate 100 and the device isolation layer 102 to form trenches having line shapes extending in a second direction D2, forming a gate insulating layer covering inner surfaces of the trenches, forming a first conductive layer on the gate insulating layer to fill the trenches, and etching the first conductive layer. Top surfaces of the gate lines GL may be lower than top ends of the trenches. Forming the first capping patterns 108 may include forming a first capping layer filling trenches on the gate lines GL, and planarizing the first capping layer until a top surface of the substrate 100 is exposed.

An ion implantation process may be performed on the active regions ACT to form a first dopant region SD1 and second dopant regions SD2 in each of the active regions ACT. The second dopant regions SD2 may be spaced apart from each other with the first dopant region SD1 interposed therebetween in each of the active regions ACT. In some embodiments, the first and second dopant regions SD1 and SD2 may be doped with N-type dopants. In some embodiments, the first dopant region SD1 may be deeper than the second dopant regions SD2 in the substrate 100.

A poly-crystalline silicon layer doped with dopants, a single-crystalline silicon layer doped with dopants, or a conductive layer may be formed on the substrate 100 and may be then patterned to form first pads 122 and second patterns 124. The first pads 122 may be connected to the first dopant regions SD1, respectively, and the second pads 124 may be connected to the second dopant regions SD2, respectively.

A first interlayer insulating layer 126 may be formed on the first and second pads 122 and 124 and the substrate 100. The first interlayer insulating layer 126 may be formed using a chemical vapor deposition (CVD) process. The first interlayer insulating layer 126 may include at least one of a silicon oxide layer, a silicon nitride layer, and/or a silicon oxynitride layer.

Bit line contact holes may be formed to penetrate the first interlayer insulating layer 126. The bit line contact holes may expose the first pads 122, respectively. A second conductive layer may be formed on the first interlayer insulating layer 126 to fill the bit line contact holes. The second conductive layer may include a conductive material such as a metal and/or a doped semiconductor material. A second capping layer may be formed on the second conductive layer. For example, the second capping layer may include at least one of a silicon nitride layer, a silicon oxide layer, and/or a silicon oxynitride layer. The second capping layer and the second conductive layer may be patterned to form bit lines BL and second capping patterns 142 respectively disposed on the bit lines BL. In addition, bit line contacts 132 may be formed in the bit line contact holes, respectively. In some embodiments, the bit line contacts 132 may correspond to portions of the second conductive layer which fill the bit line contact holes, respectively. A spacer layer may be conformally formed on the first interlayer insulating layer 126, the bit lines BL and the second capping patterns 142, and an anisotropic etching process may be performed on the spacer layer to form bit line spacers 144 on both sidewalls of each of the bit lines BL. The bit line spacers 144 may include at least one of silicon nitride, silicon oxide, and/or silicon oxynitride.

A second interlayer insulating layer 136 may be formed on the first interlayer insulating layer 126. The second interlayer insulating layer 136 may be formed using a CVD process. For example, the second interlayer insulating layer 136 may include at least one of a silicon oxide layer, a silicon nitride layer, and/or a silicon oxynitride layer. Buried contact holes may be formed to penetrate the second interlayer insulating layer 136 and the first interlayer insulating layer 126. The buried contact holes may expose the second pads 124, respectively. A third conductive layer may be deposited on the second interlayer insulating layer 136 to fill the buried contact holes, and a planarization process may be performed on the third conductive layer until a top surface of the second interlayer insulating layer 136 is exposed, thereby forming buried contacts 134 in the buried contact holes, respectively.

An insulating layer may be formed on the second interlayer insulating layer 136. The insulating layer may include at least one of a silicon oxide layer, a silicon nitride layer, and/or a silicon oxynitride layer. The insulating layer may be patterned to form an insulating pattern 146 including landing pad holes. Landing pads LP may be respectively formed in the landing pad holes by filling the landing pad holes with a conductive material. The landing pads LP may be in contact with the buried contacts 134, respectively. The landing pads LP may be electrically connected to the second dopant regions SD2 through the buried contacts 134, respectively.

A first etch stop layer 210a, a first lower mold layer 220a, a first lower support layer 230a, a first upper mold layer 240a, and a first upper support layer 250a may be sequentially formed on the insulating pattern 146 and the landing pads LP.

The first etch stop layer 210a may be formed of a material having an etch selectivity with respect to the insulating pattern 146 and the first lower mold layer 220a. For example, the first etch stop layer 210a may be formed of a silicon nitride layer and/or a silicon oxynitride layer.

For example, the first lower mold layer 220a may be formed of at least one of a silicon oxide layer, a crystalline silicon layer, an amorphous silicon layer, a doped silicon layer, a silicon-germanium layer, and/or a carbon-based material layer. The first lower mold layer 220a may be formed using a deposition process such as a CVD process or a physical vapor deposition (PVD) process.

The first lower support layer 230a may be formed of a material having an etch selectivity with respect to the first lower and upper mold layers 220a and 240a. For example, the first lower support layer 230a may be formed of at least one of SiN, SiCN, TaO, and/or $TiO_2$. The first lower support layer 230a may have a thickness of about 100 Å to about 500 Å.

The first upper mold layer 240a may be formed of the same material as the first lower mold layer 220a and may be formed by the same method as the first lower mold layer 220a. In some embodiments, the first upper mold layer 240a may have substantially the same thickness as the first lower mold layer 220a or may be thinner than the first lower mold layer 220a.

The first upper support layer 250a may be formed of the same material as the first lower support layer 230a and may be formed by the same method as the first lower support layer 230a. The first upper support layer 250a may have substantially the same thickness as the first lower support layer 230a or may be thicker than the first lower support layer 230a. For example, the first upper support layer 250a may have a thickness of about 300 Å to about 1500 Å.

Figure 4B:
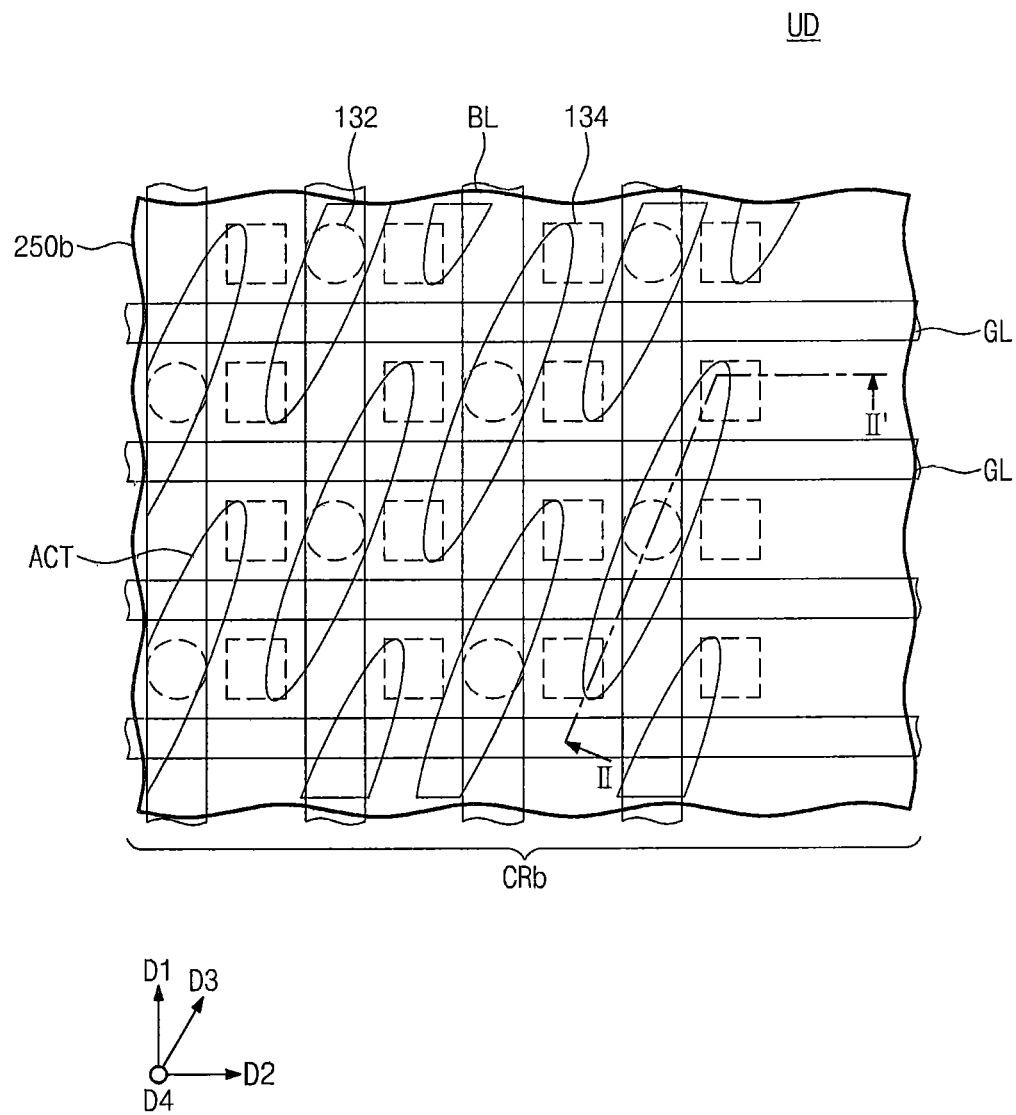
FIGS. 4B, 6B, 8B, and 10B are plan views illustrating methods for manufacturing a semiconductor device on a second chip region, according to some embodiments of the inventive concepts.
Figure 5B:
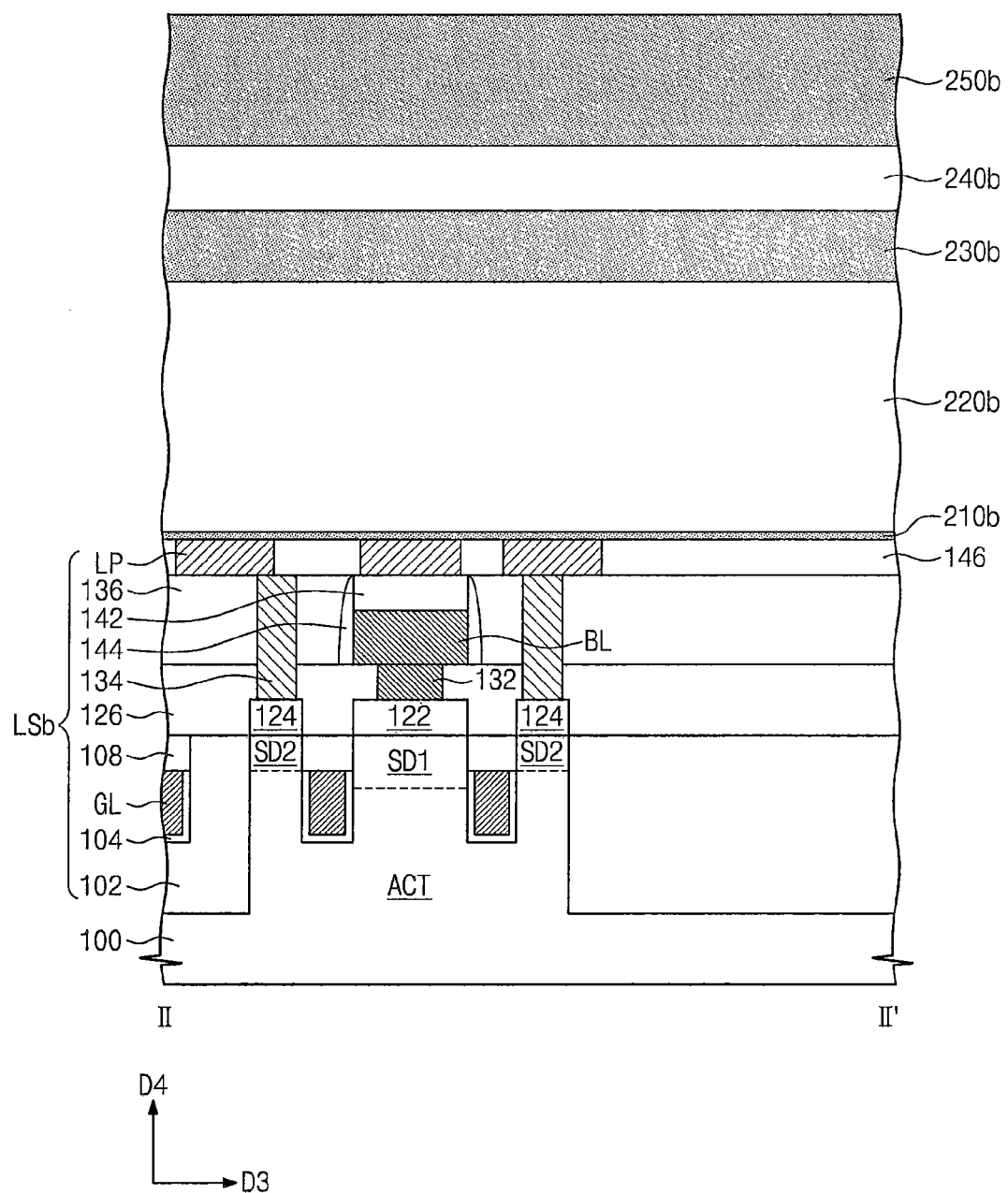
FIGS. 5B, 7B, 9B, and 11B are cross-sectional views taken along lines II-II' of 4B, 6B, 8B, and 10B, respectively.
Figure 6A:
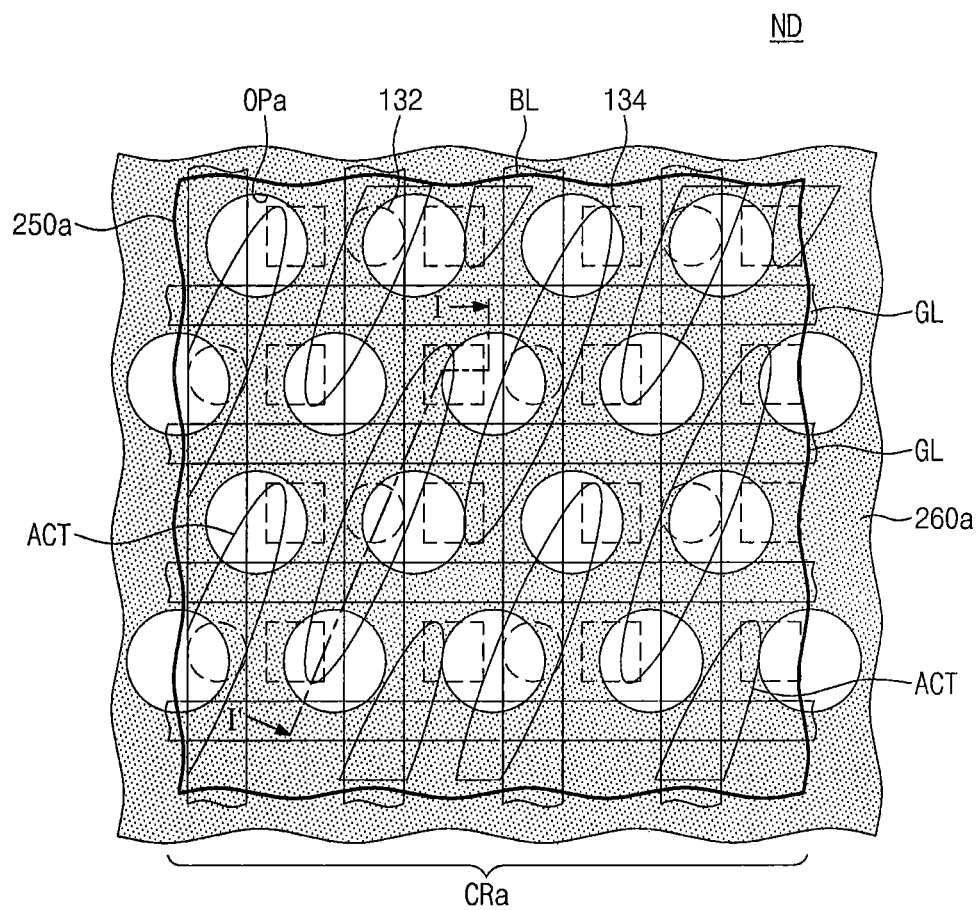
Figure 6A:
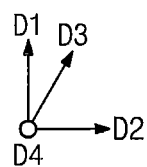
Figure 6B:
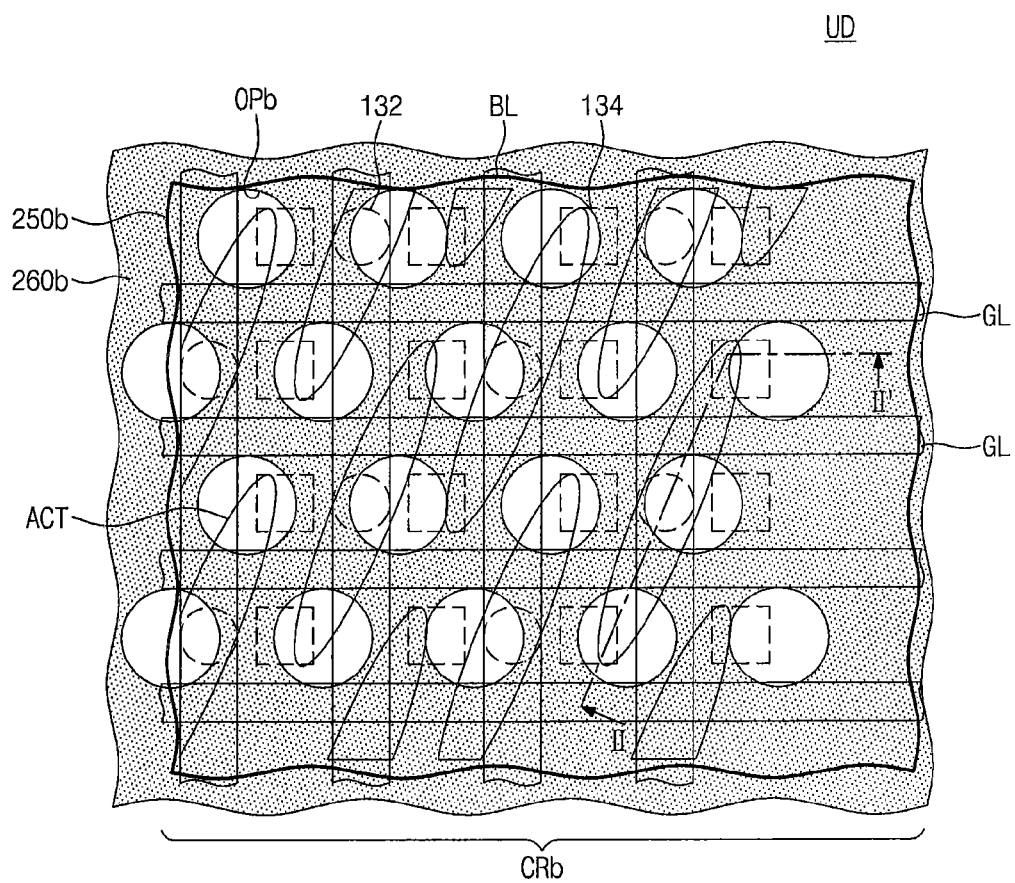
Figure 7A:
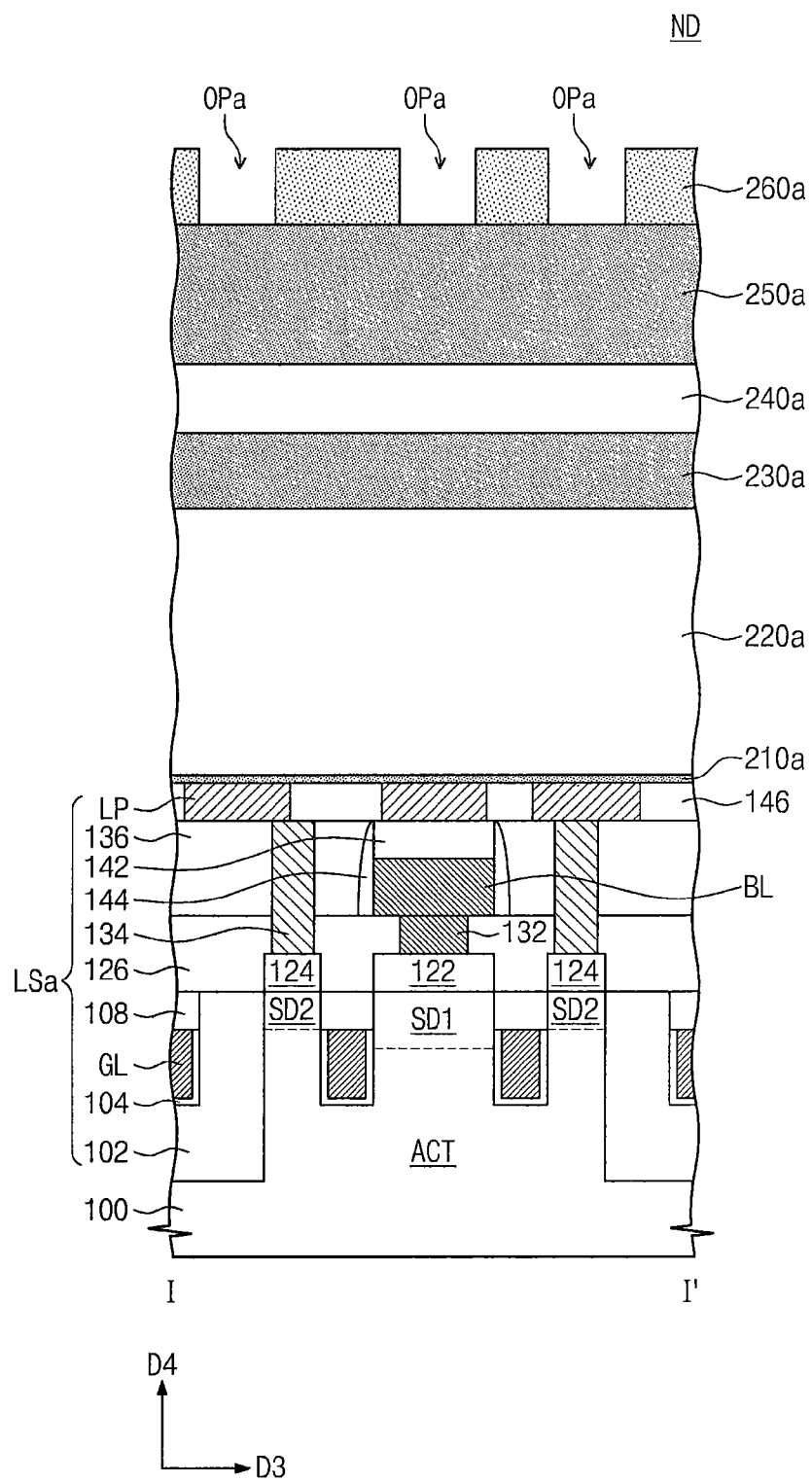
Figure 7B:
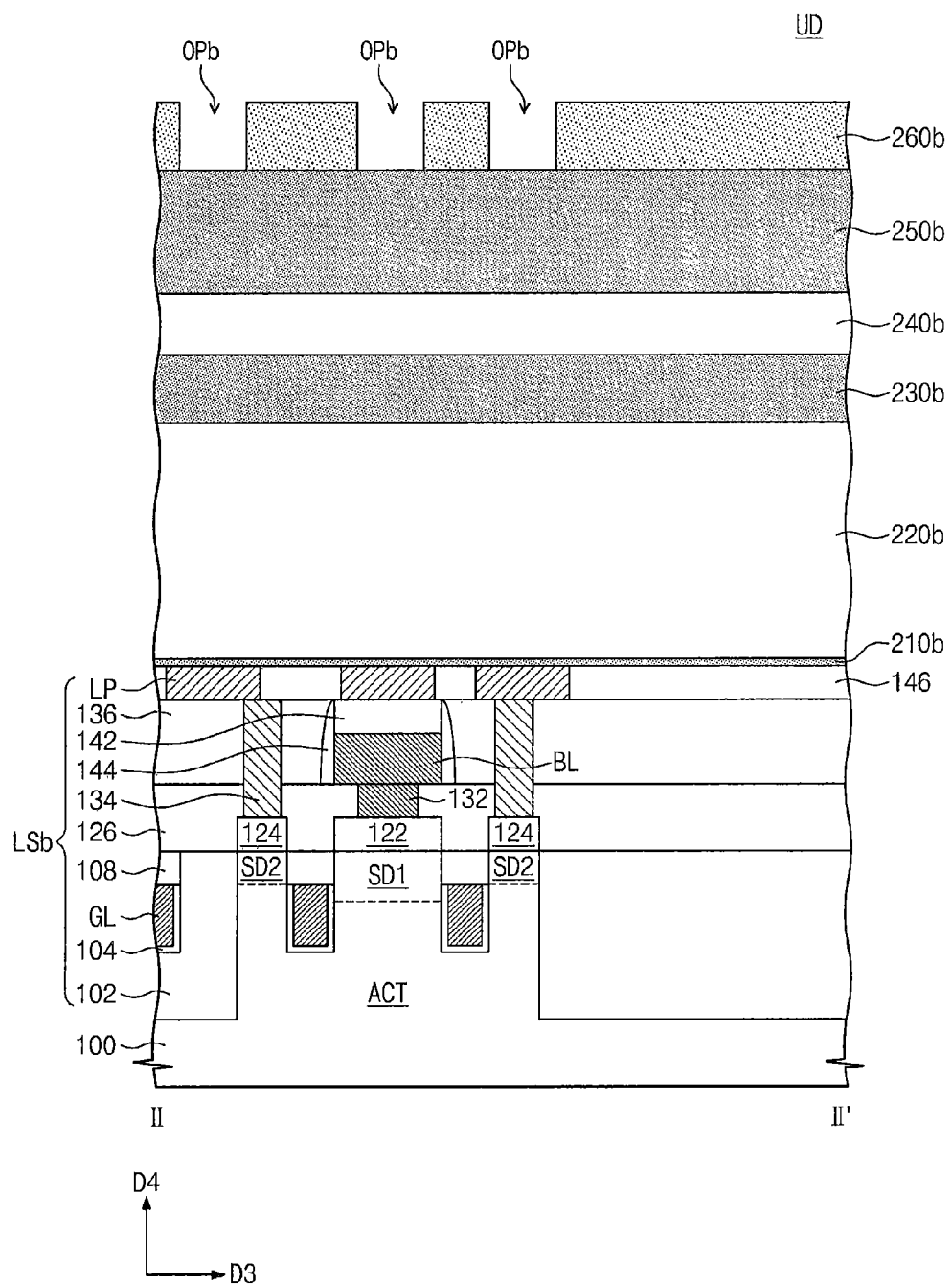
Figure 8A:
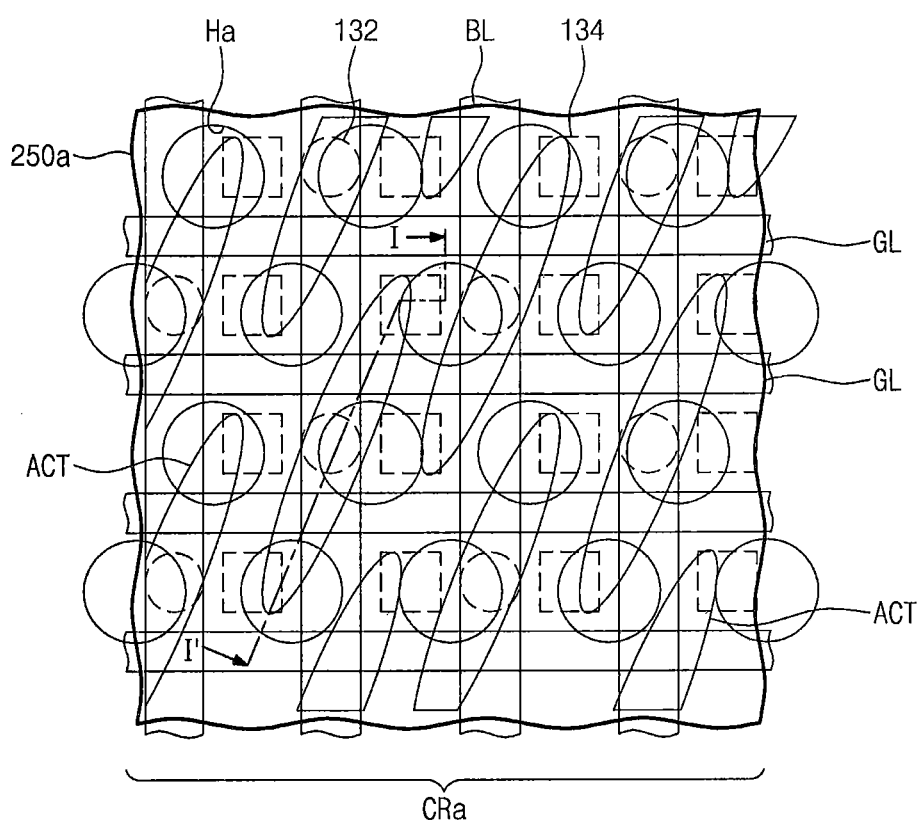
Figure 8B:
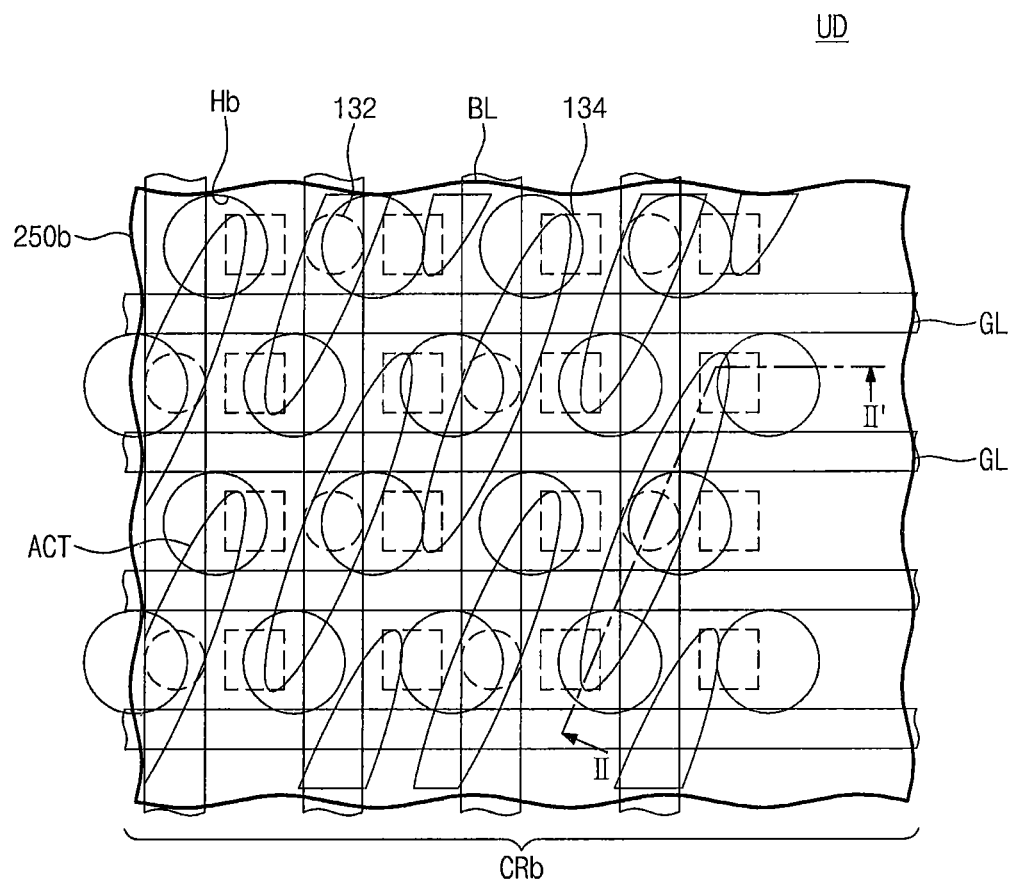
Figure 9A:
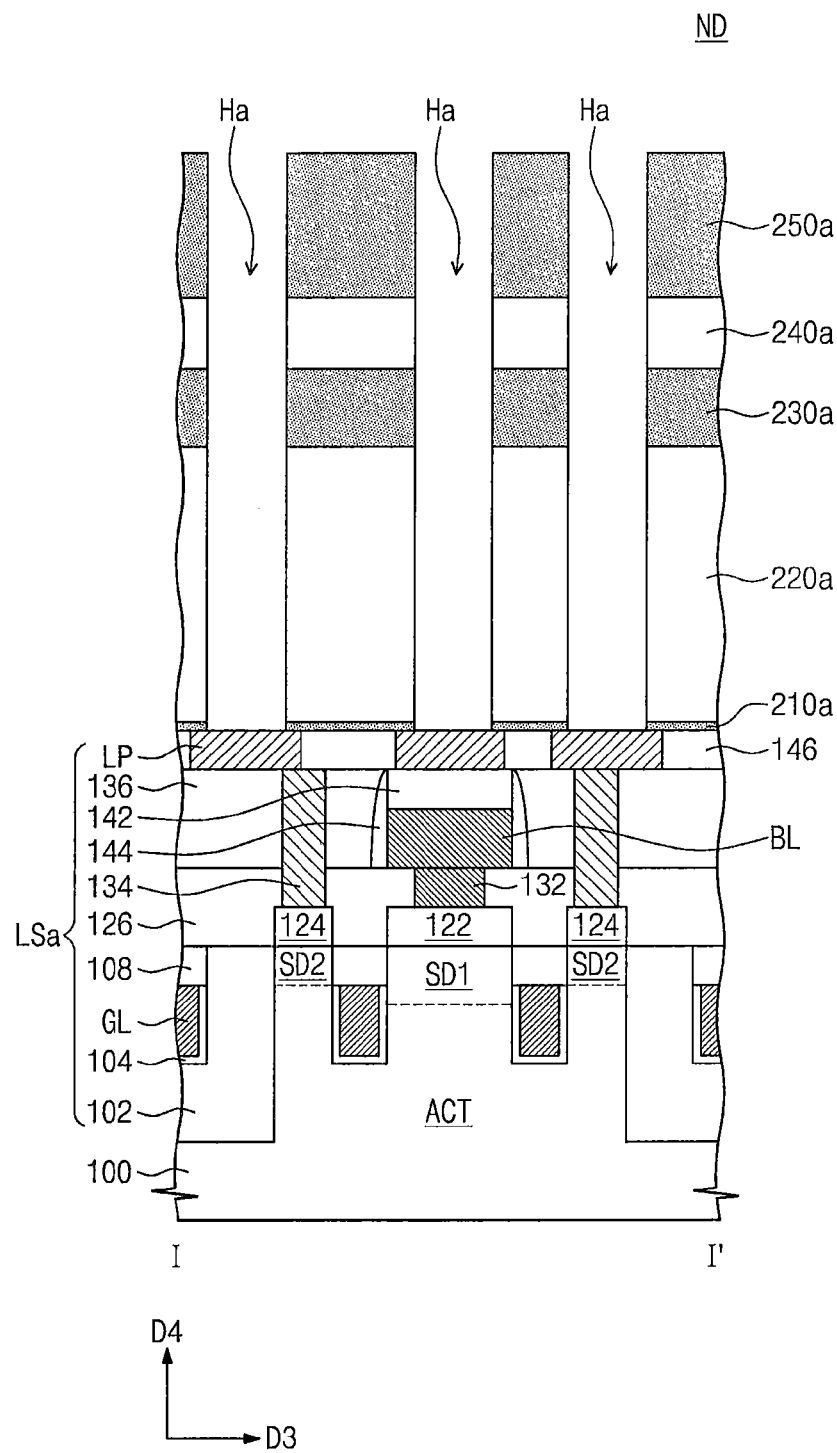
Figure 9B:
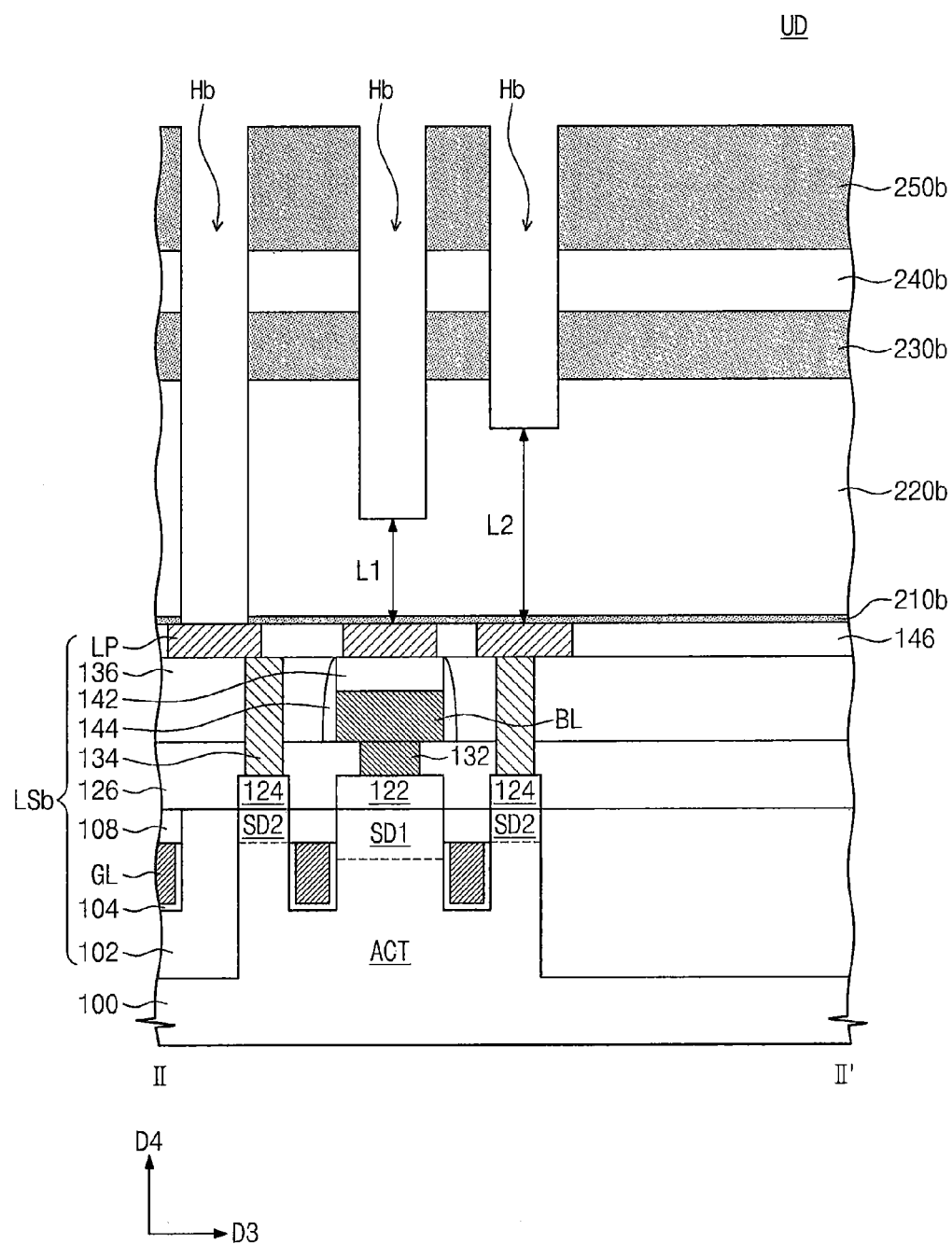
Figure 10A:
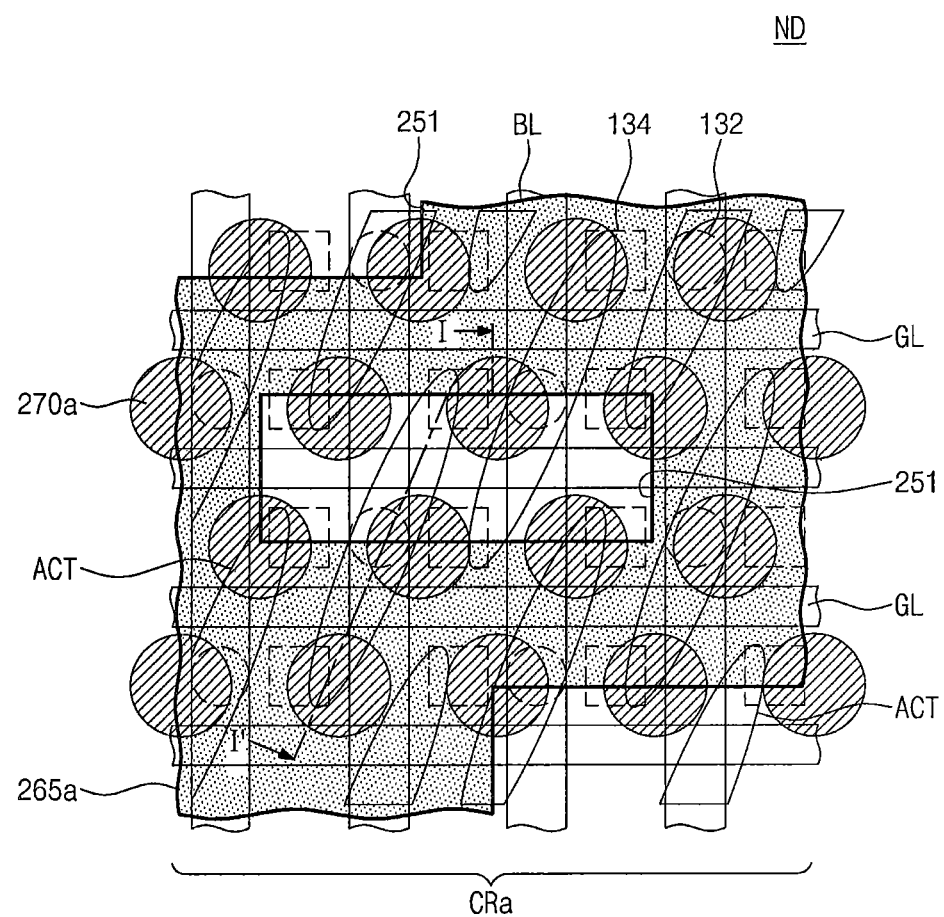
Figure 10B:
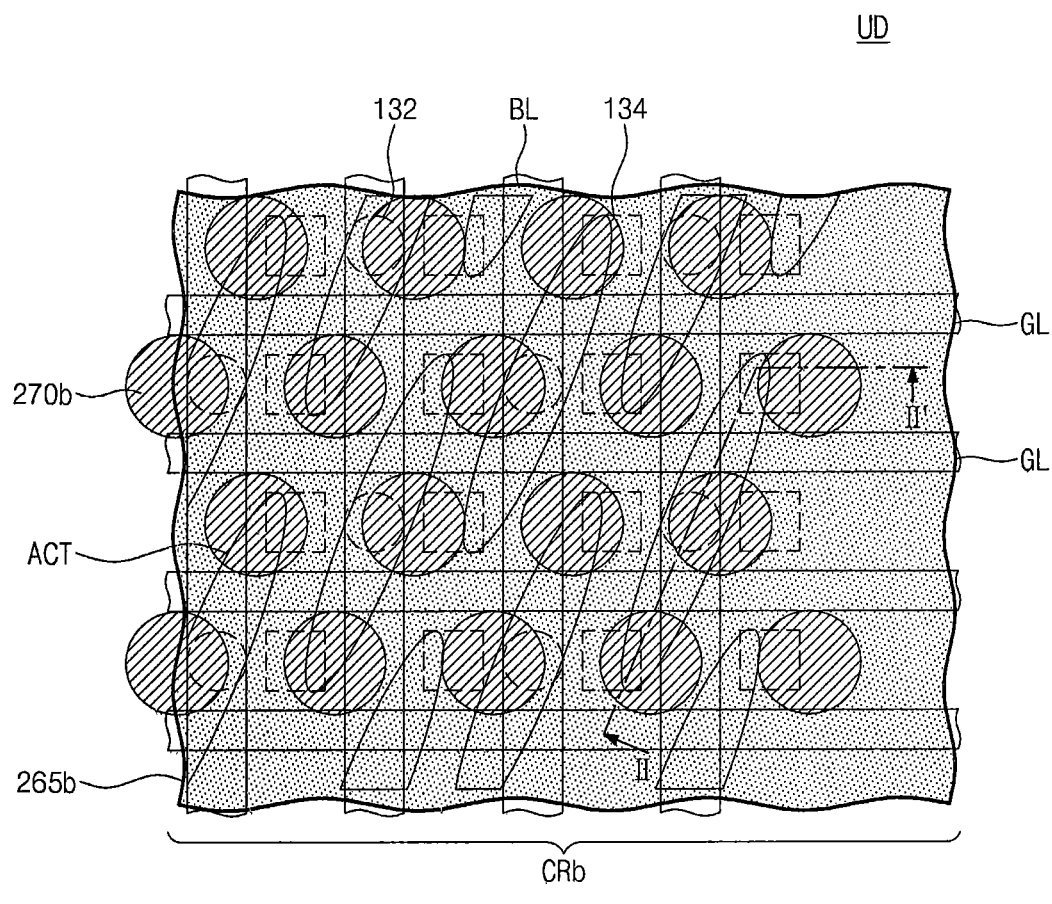
Figure 11A:
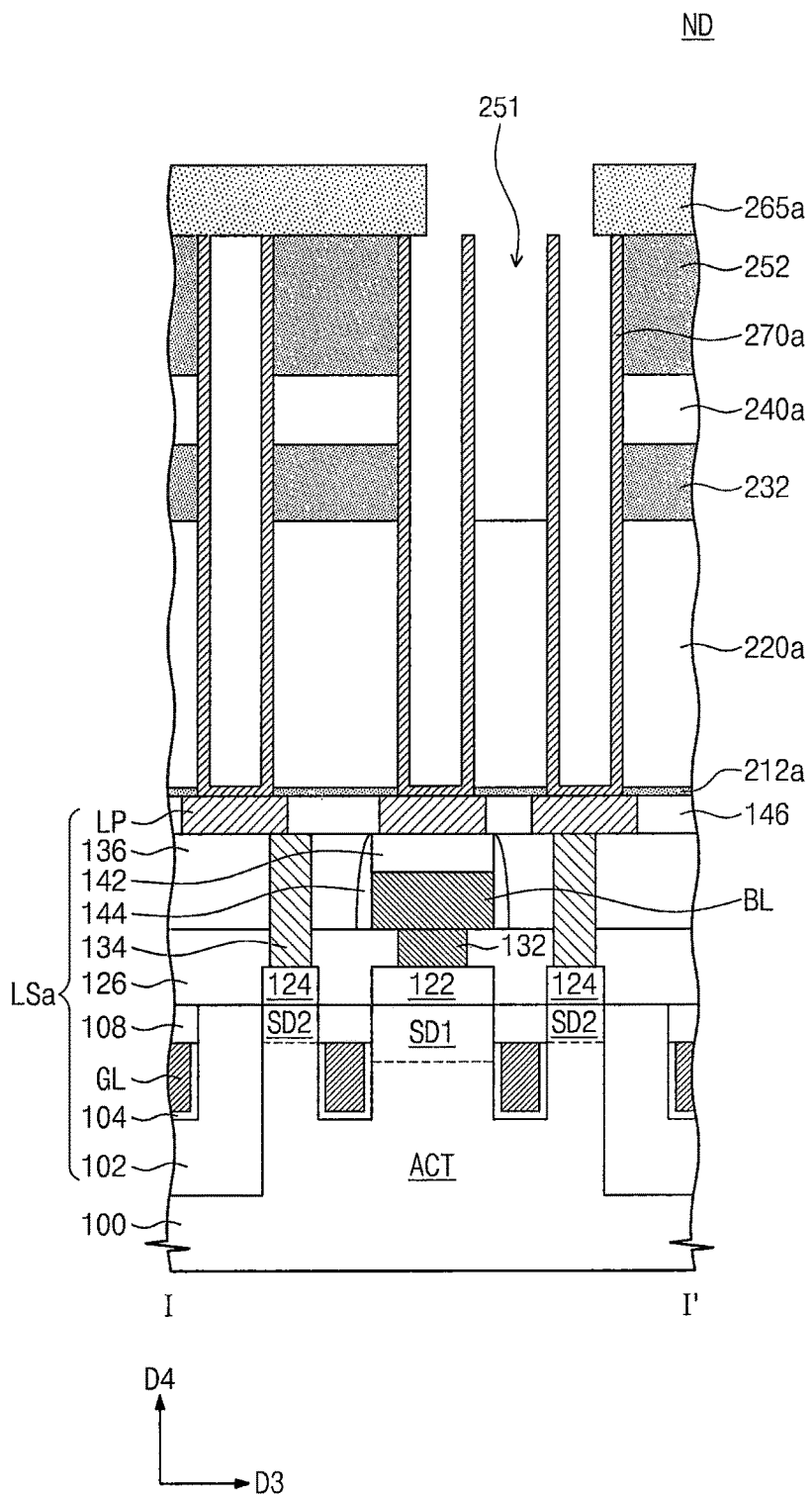
Figure 11B:
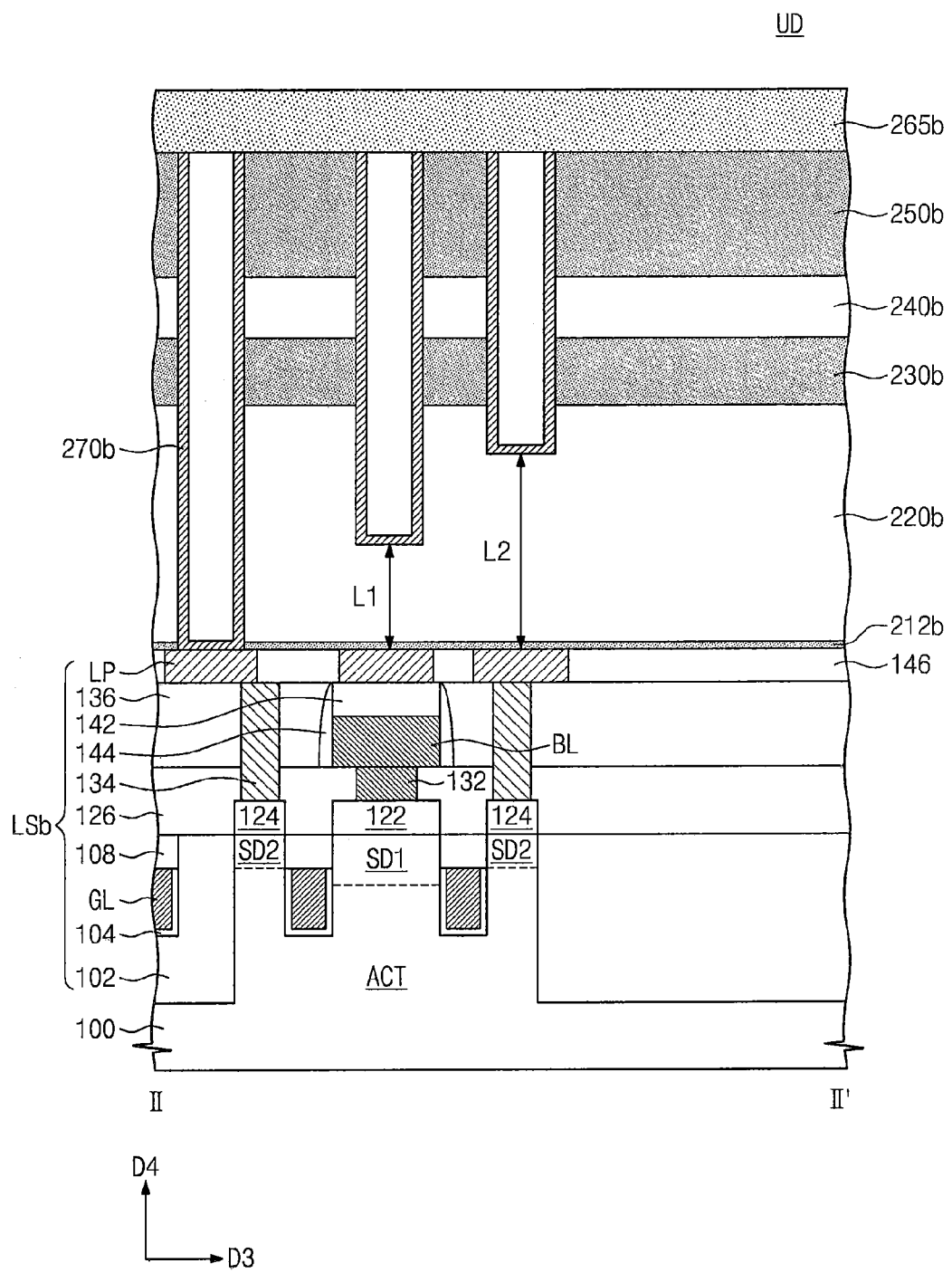

On the other hand, referring to FIGS. 4B and 5B, a second lower structure LSb may be formed on the substrate 100 of the second cell region CRb. The second lower structure LSb may be formed by the same processes as the first lower structure LSa described with reference to FIGS. 4A and 5A. The second lower structure LSb and the first lower structure LSa may be formed at the same time.

A second etch stop layer 210b, a second lower mold layer 220b, a second lower support layer 230b, a second upper mold layer 240b, and a second upper support layer 250b may be sequentially formed on the insulating pattern 146 of the second lower structure LSb. The layers 210b, 220b, 230b, 240b, and 250b may be formed simultaneously with the first etch stop layer 210a, the first lower mold layer 220a, the first lower support layer 230a, the first upper mold layer 240a, and the first upper support layer 250a described with reference to FIGS. 4A and 5A, respectively.

Referring to FIGS. 6A, 6B, 7A, and 7B, a first mask pattern 260a and a second mask pattern 260b may be formed on the first upper support layer 250a and the second upper support layer 250b, respectively. The first mask pattern 260a may have first openings OPa defining first lower electrode holes Ha to be described later. The second mask pattern 260b may have second openings OPb defining second lower electrode holes Hb to be described later. The first and second mask patterns 260a and 260b may be formed of a material that has an etch selectivity with respect to the mold layers 220a, 220b, 240a, and 240b and the support layers 230a, 230b, 250a, and 250b during an anisotropic etching process for forming the first and second lower electrode holes Ha and Hb. For example, the first and second mask patterns 260a and 260b may include poly-silicon.

The first and second openings OPa and OPb may be arranged to constitute a plurality of lines parallel to a diagonal direction (i.e., a third direction D3) when viewed from a plan view. In other words, the first openings OPa (or the second openings QPb) may be arranged to constitute columns parallel to a first direction D1, and the first openings OPa (or the second openings OPb) constituting two columns adjacent one another may be arranged in a zigzag form along the first direction D1.

Methods of forming the first and second mask patterns 260a and 260b according to some embodiments will be described hereinafter. A mask layer may be formed on the first and second upper support layer 250a and 250b. First spacer lines (not shown) extending in a second direction D2 may be formed on the mask layer, and second spacer lines (not shown) extending in the third direction D3 may be formed on the first spacer lines and the mask layer. The first spacer lines and the second spacer lines may be formed by a double patterning technique (DPT). The mask layer may be etched using the first and second spacer lines as etch masks to form the first and second mask patterns 260a and 260b. However, embodiments of the inventive concepts are not limited thereto. The first and second mask patterns 260a and 260b may be formed using at least one of other various methods.

Referring to FIGS. 8A, 8B, 9A, and 9B, the support layers 230a, 230b, 250a, and 250b and the mold layers 220a, 220b, 240a, and 240b may be anisotropically etched using the first and second mask patterns 260a and 260b. Thus, first lower electrode holes Ha may be formed to penetrate the first upper and lower support layers 250a and 230a and the first upper and lower mold layers 240a and 220a, and second lower electrode holes Hb may be formed to penetrate the second upper and lower support layers 250b and 230b and the second upper and lower mold layers 240b and 220b. When the first and second lower electrode holes Ha and Hb are formed, the first and second etch stop layers 210a and 210b may also be etched by over-etching. Thus, first and second etch stop patterns 212a (FIG. 11A) and 212b (FIG. 11B) may be formed. The first and second lower electrode holes Ha and Hb may be two-dimensionally arranged to correspond to the first and second openings OPa and QPb.

The first lower electrode holes Ha may expose the landing pads LP of the first lower structure LSa, respectively. On the other hand, the second chip region UD may be on an edge of a wafer, and thus the anisotropic etching process may not be sufficiently performed on the second chip region UD. As a result, one or some of the second lower electrode holes Hb may not expose corresponding ones of the landing pads LP of the second lower structure LSb. For example, a bottom surface of one of the second lower electrode holes Hb may be vertically spaced apart from the corresponding landing pad LP by a first length L1, and a bottom surface of another of the second lower electrode holes Hb may be vertically spaced apart from the corresponding landing pad LP by a second length L2. The lengths L1 and L2 may sequentially increase as a lateral distance from a center of the second cell region CRb increases. This may be because an etch rate may be progressively reduced as the lateral distance from the center increases.

The first and second mask patterns 260a and 260b remaining on the upper support layers 250a and 250b may be removed after the formation of the first and second lower electrode holes Ha and Hb.

Referring to FIGS. 10A, 10B, 11A, and 11B, first lower electrodes 270a and second lower electrodes 270b may be formed in the first lower electrode holes Ha and the second lower electrode holes Hb, respectively. Forming the first and second lower electrodes 270a and 270b may include depositing a fourth conductive layer in the first and second lower electrode holes Ha and Hb, and planarizing the fourth conductive layer until the top surfaces of the first and second upper support layers 250a and 250b are exposed.

The fourth conductive layer may be deposited using a layer-formation technique having an excellent property of step coverage, such that a CVD process or an atomic layer deposition (ALD) process. In some embodiments, a thickness of the fourth conductive layer may be smaller than a half of a width of each of the first and second lower electrode holes Ha and Hb. In this case, after the deposition of the fourth conductive layer, a sacrificial layer (not shown) may be additionally formed on the fourth conductive layer to completely fill the first and second lower electrode holes Ha and Hb. The fourth conductive layer may include at least one of doped silicon, a metal material, a metal nitride, a metal silicide, a conductive noble metal oxide, and/or a conductive oxide.

The planarization process of the fourth conductive layer may include a chemical mechanical polishing (CMP) process or a dry etch-back process. The first and second lower electrodes 270a and 270b having cylindrical shapes may be formed by the planarization process. Top surfaces of the first and second lower electrodes 270a and 270b may be substantially coplanar with the top surfaces of the first and second upper support layers 250a and 250b.

Next, a third mask pattern 265a and a fourth mask pattern 265b may be formed on the first upper support layer 250a and the second upper support layer 250b, respectively. The third mask pattern 265a may have third openings for forming lower and upper support patterns 232 and 252. However, the fourth mask pattern 265b may completely cover the top surface of the second upper support layer 250b without an opening.

The first upper and lower support layers 250a and 230a may be sequentially patterned using the third mask pattern 265a to form the upper and lower support patterns 252 and 232. Due to the third openings of the third mask pattern 265a, the upper support pattern 252 may have upper openings 251 and the lower support pattern 232 may have lower openings. The lower openings and the upper openings 251 may have bar shapes, rectangular shapes, and/or line shapes when viewed from a plan view. When the first upper and lower support layers 250a and 230a are patterned, a portion of the first upper mold layer 240a may also be etched. In addition, portions of the first lower and upper mold layers 220a and 240a may be exposed through the lower openings and the upper openings 251.

While the lower and upper support patterns 232 and 252 are formed on the first chip region ND, the second lower and upper support layers 230b and 250b of the second chip region UD may be protected by the fourth mask pattern 265b. Thus, the second lower and upper support layers 230b and 250b may be widely spread in a plan view, and the second lower and upper mold layers 220b and 240b may not be exposed outward.

Referring to FIGS. 2A, 2B, 12A, and 12B, remaining third and fourth mask patterns 265a and 265b may be removed, and then, the first upper and lower mold layers 240a and 220a may be removed.

The process of removing the first upper and lower mold layers 240a and 220a may be performed using a wet etching process. In some embodiments, when the first upper and lower mold layers 240a and 220a are formed of silicon oxide layers, the wet etching process using a limulus amoebocyte lysate (LAL) solution may be performed to remove the first upper and lower mold layers 240a and 220a. In some embodiments, when the first upper and lower mold layers 240a and 220a are formed of a semiconductor-based material, the etching solution of the wet etching process may include potassium hydroxide (KOH), ammonium hydroxide (NH$_4$OH), sodium hydroxide (NaOH), and/or tetramethyl ammonium hydroxide (TMAH).

The etching solution may be provided through the upper openings 251 of the upper support pattern 252 and the lower openings of the lower support pattern 242, thereby completely removing the first lower and upper mold layers 220a and 240a. Since the first lower and upper mold layers 220a and 240a are moved, sidewalls of first lower electrodes 270a may be exposed. The lower and upper support patterns 232 and 252 may prevent the first lower electrodes 270a having a high aspect ratio from leaning.

On the other hand, the second lower and upper mold layers 220b and 240b may be protected by the second lower and upper support layers 230b and 250b during the wet etching process. Thus, the second lower and upper mold layers 220b and 240b may remain under the second lower and upper support layers 230b and 250b, respectively.

However, the etching solution may laterally permeate the second lower and upper mold layers 220b and 240b from the first chip region ND adjacent the second chip region UD, thereby etching portions of the second lower and upper mold layers 220b and 240b. In other words, during the wet etching process, a lower recess region 225 and an upper recess region 245 may be formed in the second lower mold layer 220b and the second upper mold layer 240b, respectively. A lateral recessed depth of the lower recess region 225 may be greater than that of the upper recess region 245.

In some embodiments, the second upper support layer 250b disposed at the same level as the upper support pattern 252 may remain on the second chip region UD as it is. Thus, a height difference between the first and second chip regions ND and UD may not occur, and thus process detects may be prevented or inhibited in subsequent processes (e.g., processes of forming metal interconnection layers on upper electrodes).

In addition, since the fourth mask pattern 265b prevents the second lower and upper support layers 230b and 250b from being patterned, the second lower and upper mold layers 220b and 240b may remain on the second chip region UD, unlike the first chip region ND. The remaining second lower and upper mold layers 220b and 240b may improve structural stability of the second chip region UD, and thus it is possible to prevent the second lower electrodes 270b from leaning or moving into the first chip region ND adjacent thereto.

Referring again to FIGS. 2A, 2B, 3A, and 3B, a first dielectric layer 280a and a first upper electrode 290a may be sequentially formed on the first lower electrodes 270a. A second dielectric layer 280b and a second upper electrode 290b may be sequentially formed on the second lower electrodes 270b. The first and second dielectric layers 280a and 280b may be formed at the same time. The first and second dielectric layers 280a and 280b may be in one body. The first and second upper electrodes 290a and 290b may be formed at the same time.

The first and second dielectric layers 280a and 280b and the first and second upper electrodes 290a and 290b may be formed using a layer-formation technique having an excellent property of step coverage, e.g., a CVD process and/or an ALD process.

The first and second dielectric layers 280a and 280b may be formed of a single layer or multi-layer including at least one of a metal oxide or a dielectric material having a perovskite structure. The first and second upper electrodes 290a and 290b may be formed of at least one of doped silicon, a metal material, a metal nitride, a metal silicide, a conductive noble metal oxide, and/or a conductive oxide.

Since the second dielectric layer 280b and the second upper electrode 290b are formed using the layer-formation technique having the excellent property of step coverage, they 280b and 290b may be sequentially formed in each of the lower and upper recess regions 225 and 245 to fill each of the lower and upper recess regions 225 and 245.

Figure 13A:
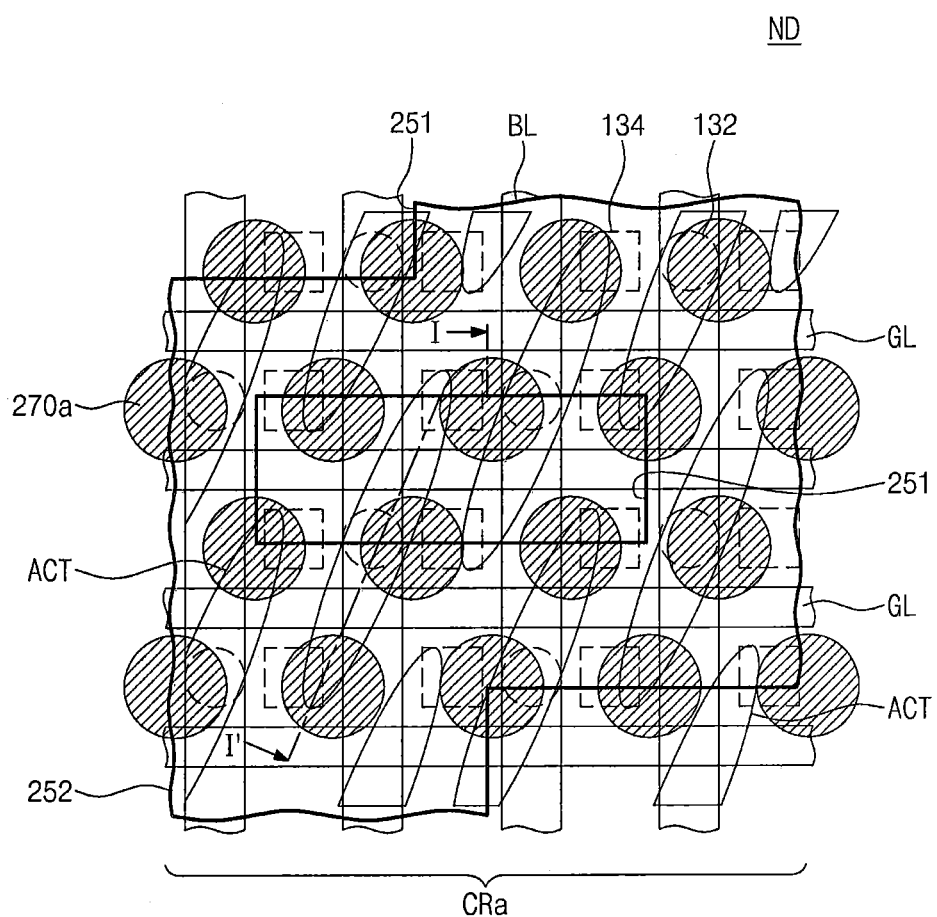
FIG. 13A is a plan view illustrating a semiconductor device on a first chip region according to some embodiments of the inventive concepts.
Figure 13B:
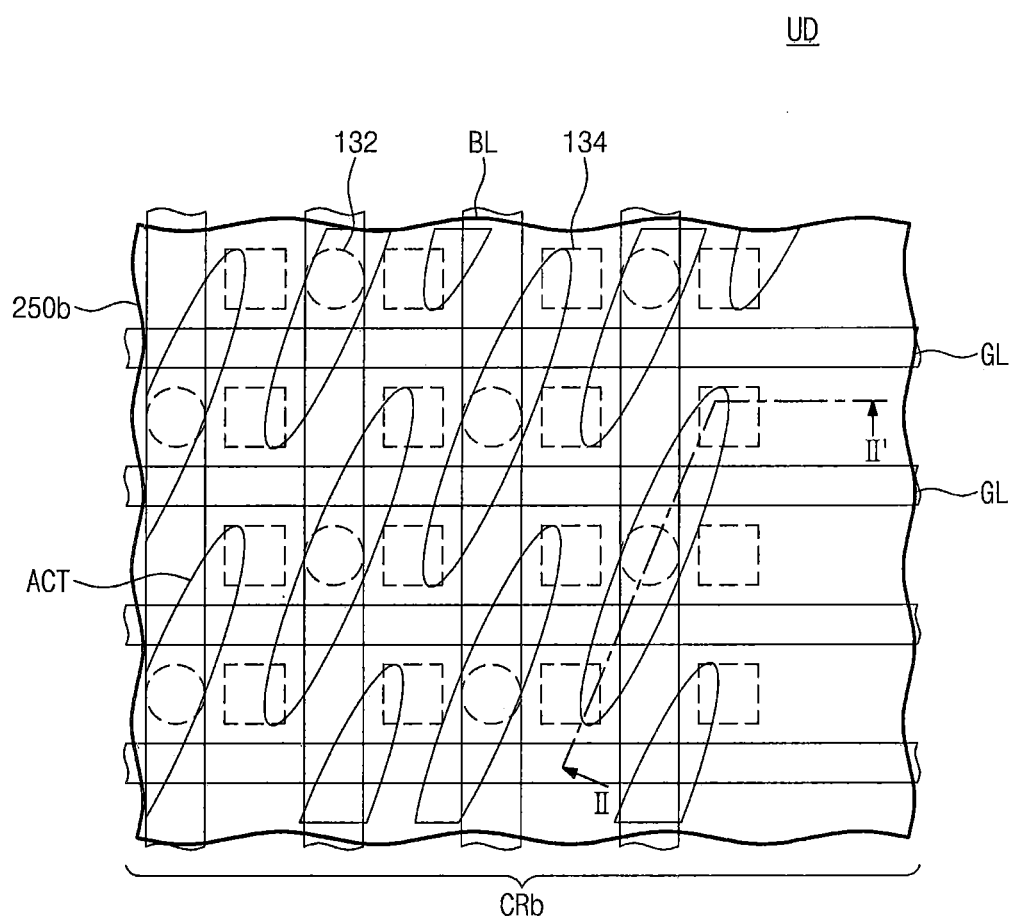
FIG. 13B is a plan view illustrating a semiconductor device on a second chip region according to some embodiments of the inventive concepts.
Figure 14A:
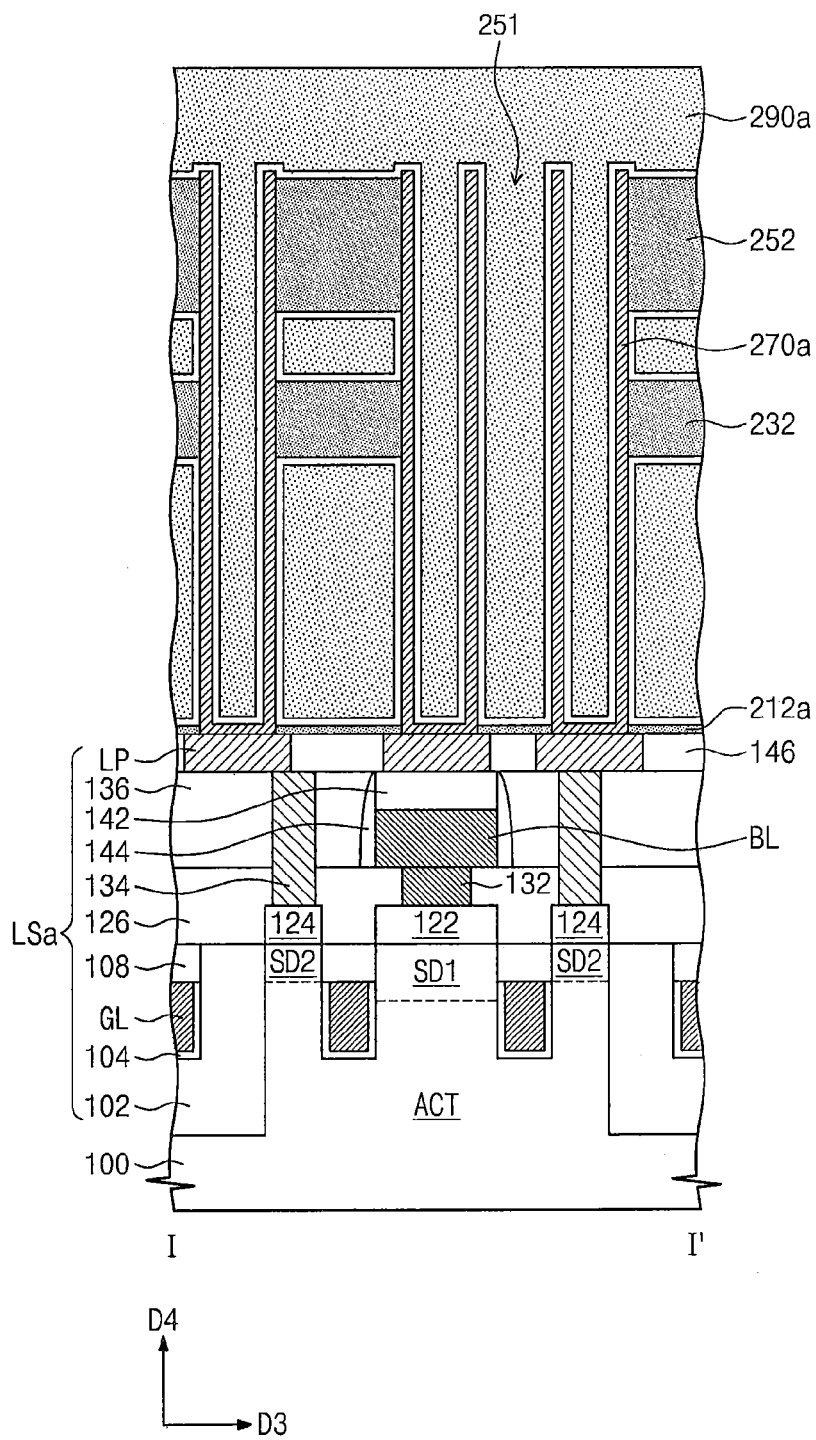
FIG. 14A is a cross-sectional view taken along a line I-I' of FIG. 13A.
Figure 14B:
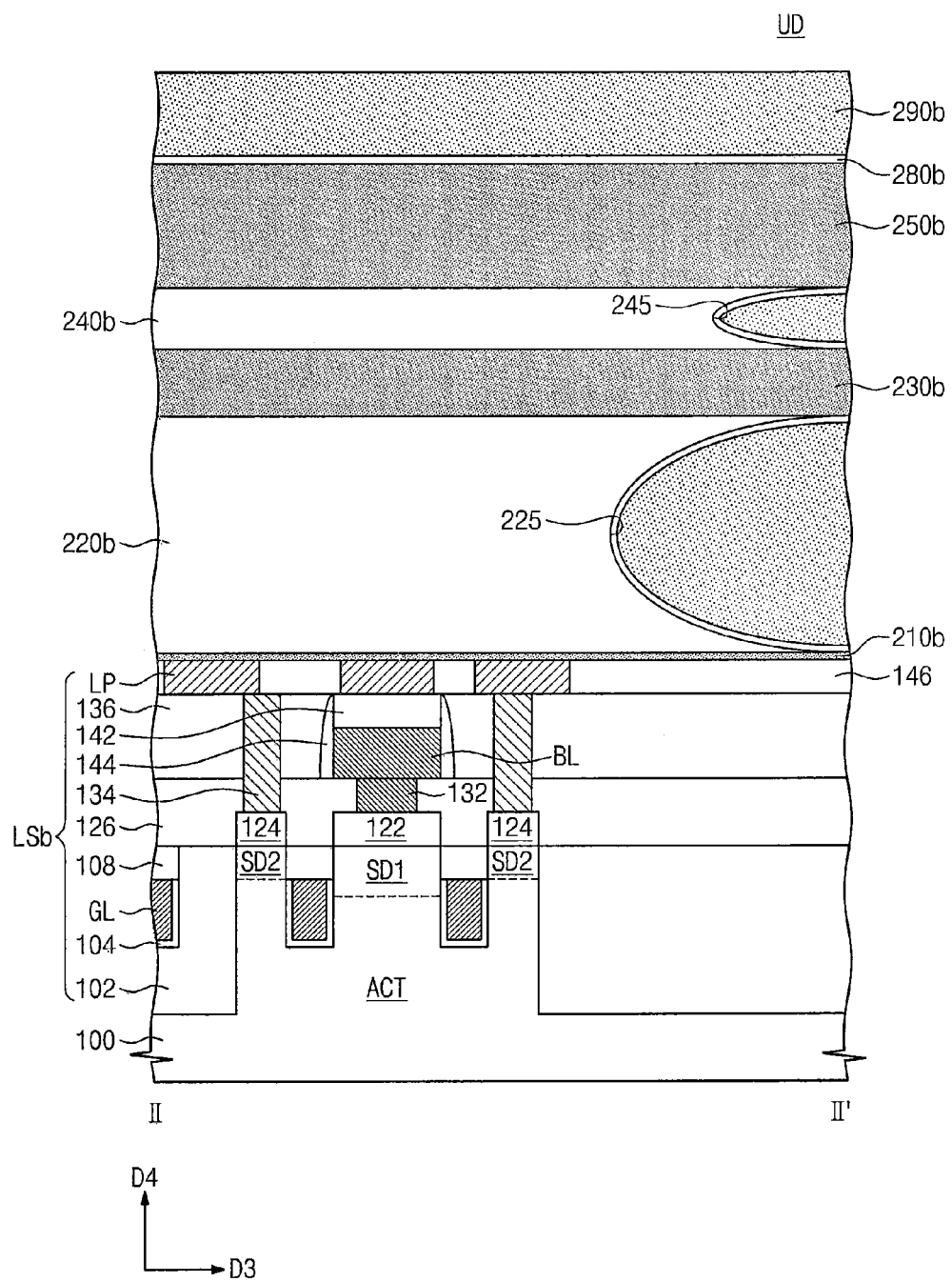
FIG. 14B is a cross-sectional view taken along a line II-II' of FIG. 13B.

FIG. 13A is a plan view illustrating a semiconductor device on a first chip region according to some embodiments of the inventive concepts. FIG. 13B is a plan view illustrating a semiconductor device on a second chip region according to some embodiments of the inventive concepts. FIG. 14A is a cross-sectional view taken along a line I-I' of FIG. 13A. FIG. 14B is a cross-sectional view taken along a line II-II' of FIG. 13B. In the present embodiment, the descriptions to the same technical features as in the embodiment of FIGS. 2A, 2B, 3A, and 3B will be omitted or mentioned briefly for the purpose of ease and convenience in explanation. In other words, differences between the present embodiment and the embodiment of FIGS. 2A, 2B, 3A, and 3B will be mainly described hereinafter.

A first lower structure LSa and capacitors of a first chip region ND illustrated in FIGS. 13A and 13B may be the same as described above with reference to FIGS. 2A and 3A. Qn the other hand, referring to FIGS. 13B and 14B, the second lower electrodes 270b of FIGS. 2B and 3B may be omitted from the second chip region UD. Thus, the second dielectric layer 280b and the second upper electrode 290b may sequentially cover the top surface of the second upper support layer 250b on the second chip region UD.

Figure 15A:
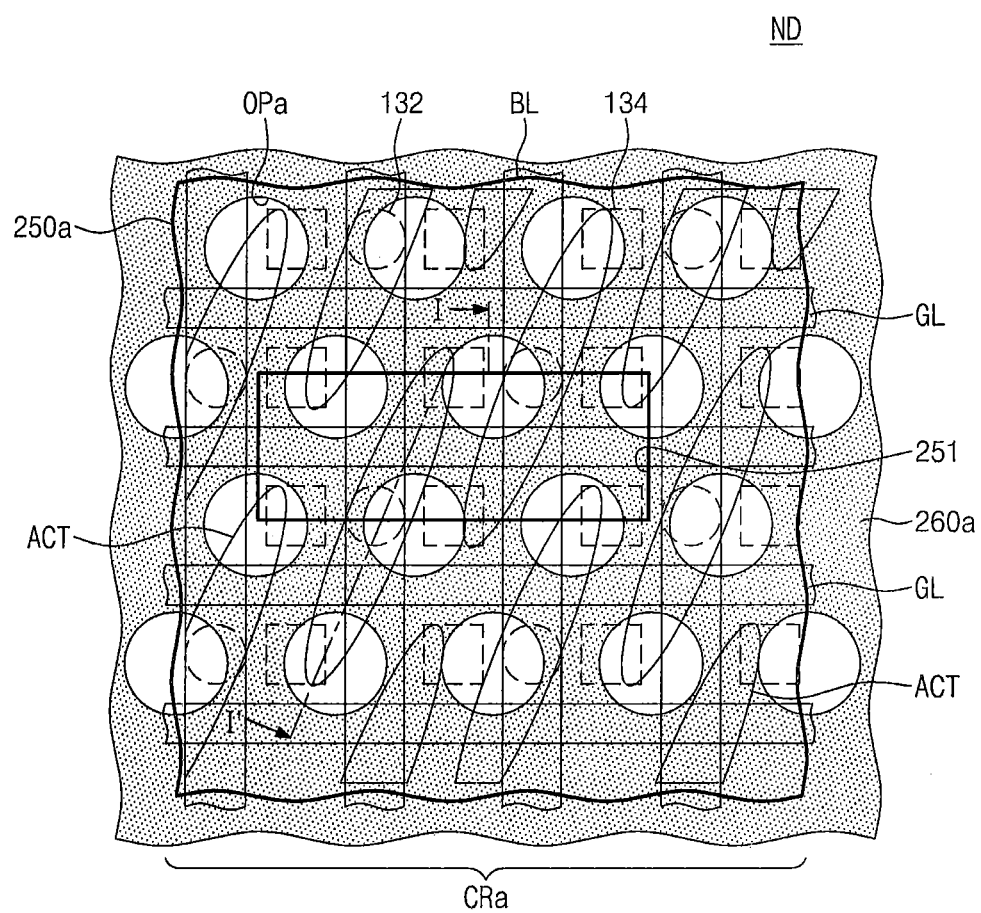
FIGS. 15A and 17A are plan views illustrating methods for manufacturing a semiconductor device on a first chip region, according to some embodiments of the inventive concepts.
Figure 15A:
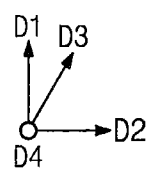
Figure 15B:
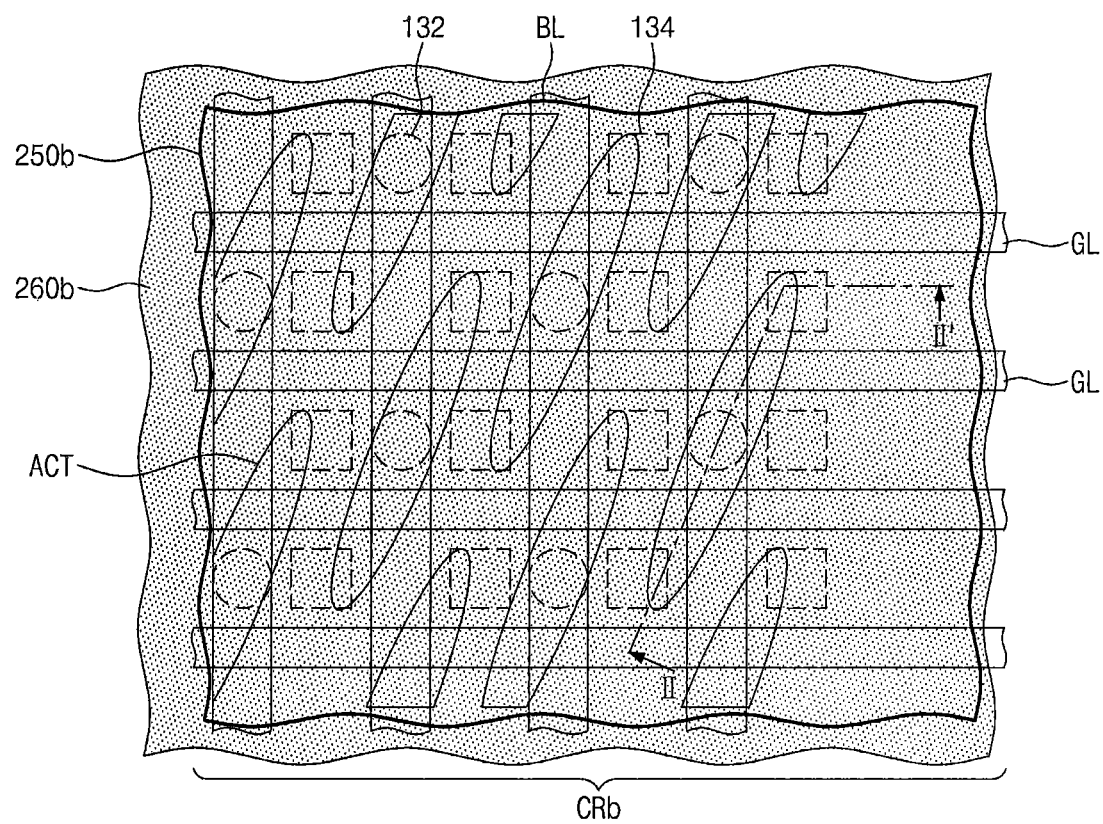
FIGS. 15B and 17B are plan views illustrating methods for manufacturing a semiconductor device on a second chip region, according to some embodiments of the inventive concepts.
Figure 16A:
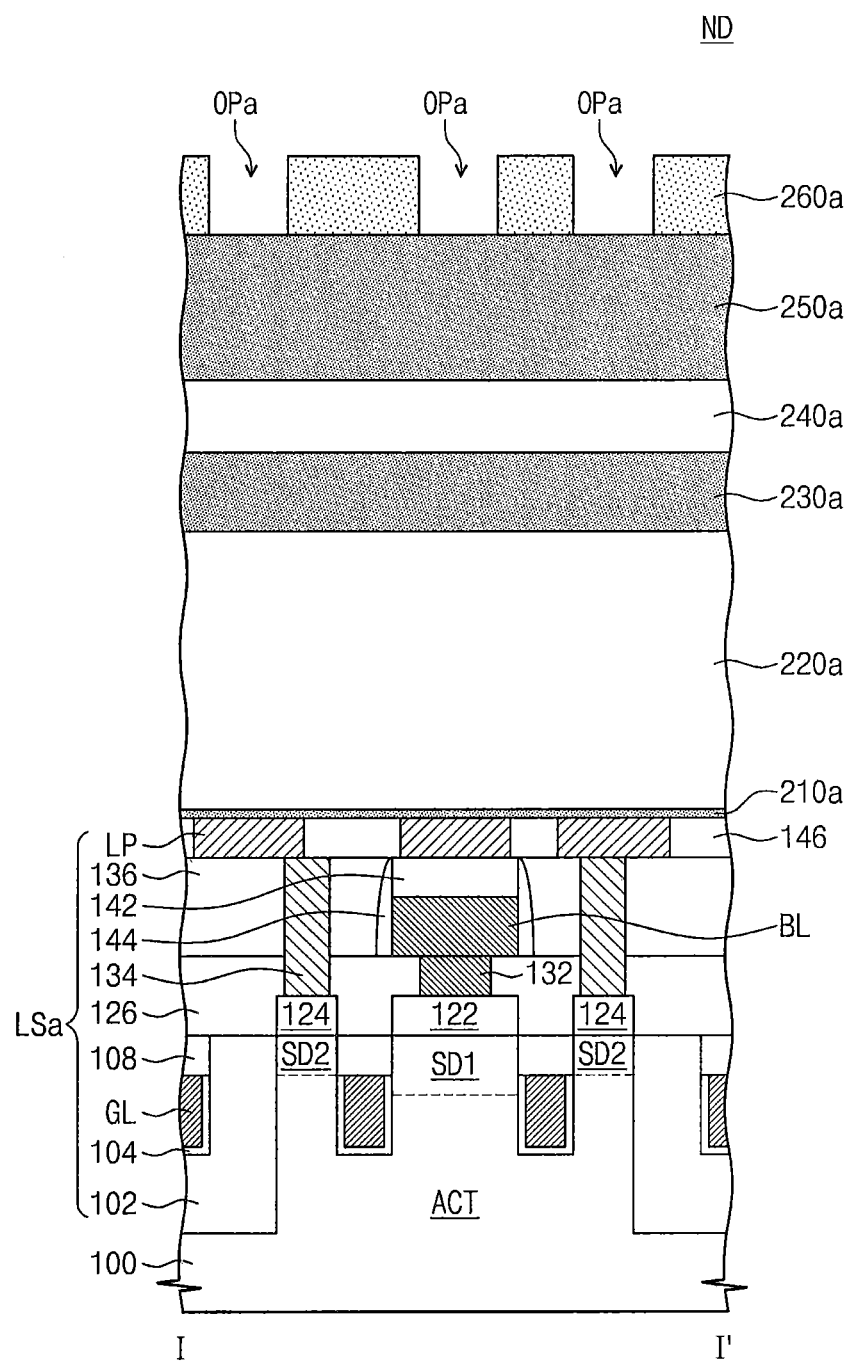
FIGS. 16A and 18A are cross-sectional views taken along lines I-I' of 15A and 17A, respectively.
Figure 16B:
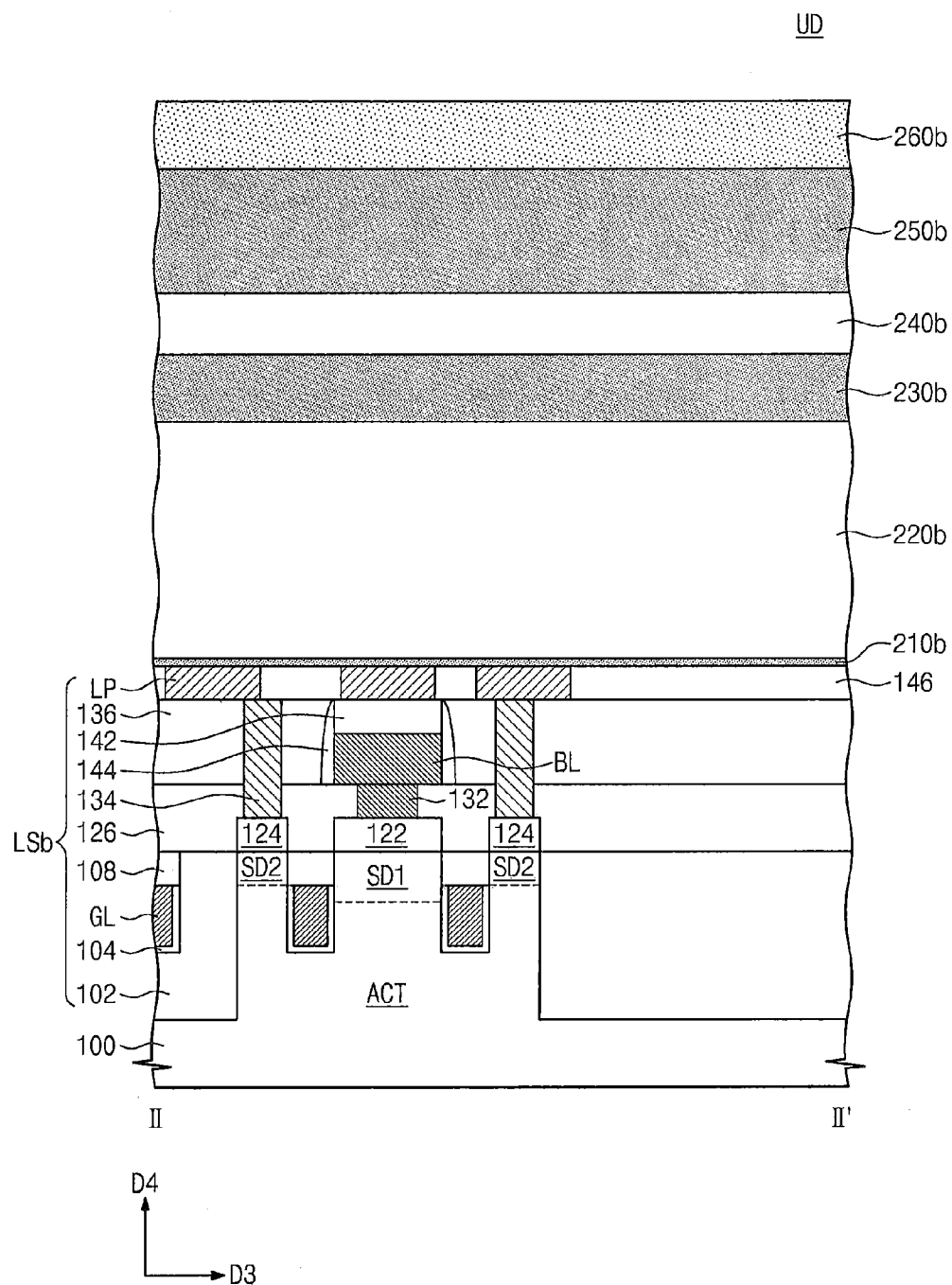
FIGS. 16B and 18B are cross-sectional views taken along lines II-II' of 15B and 17B, respectively.
Figure 17A:
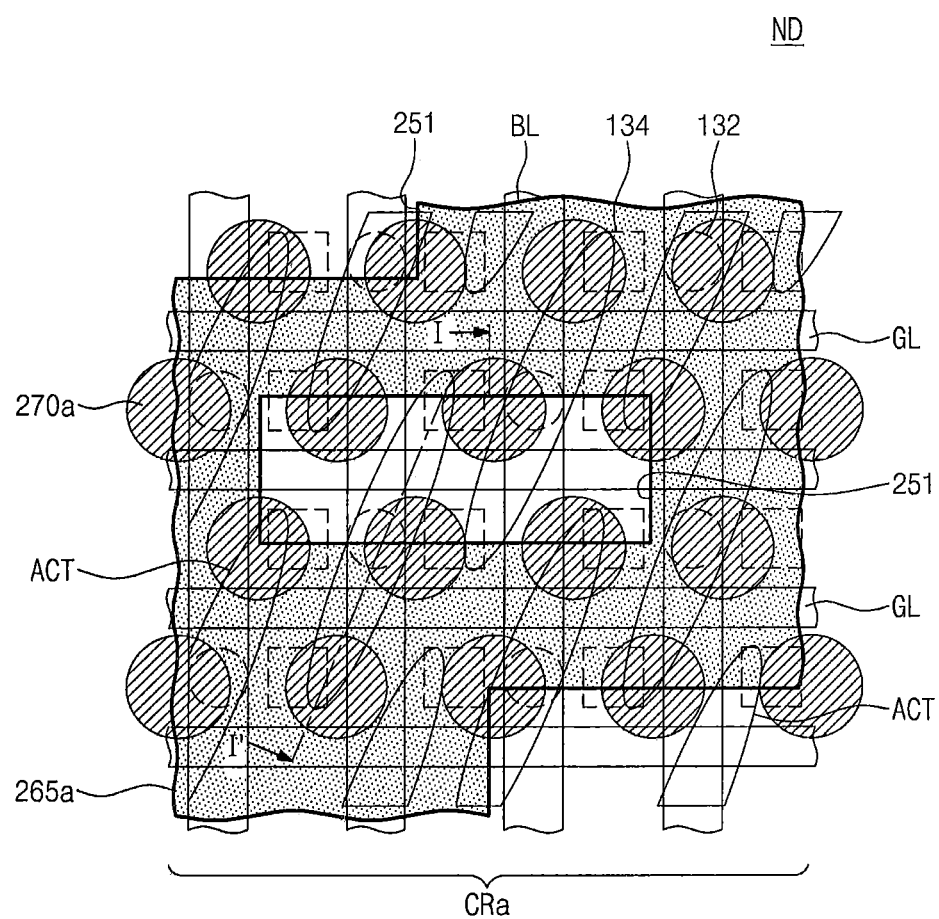
Figure 17A:
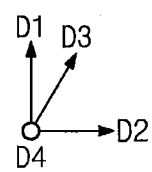
Figure 17B:
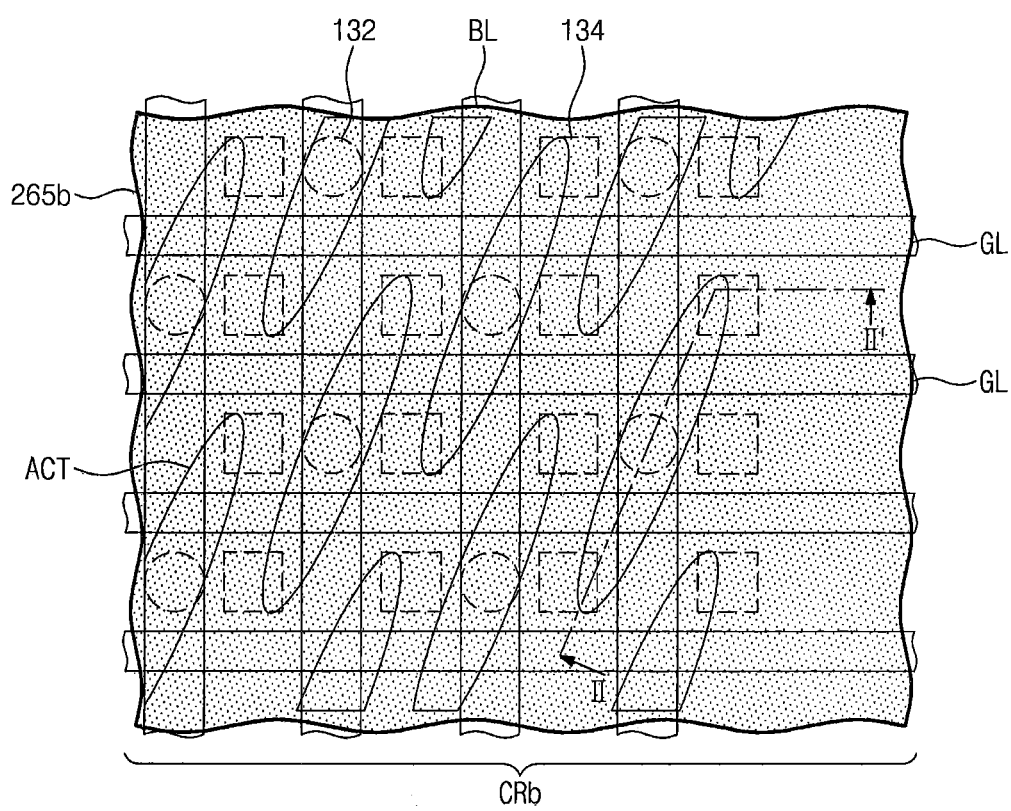
Figure 17B:
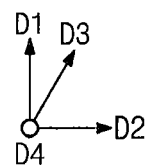
Figure 18A:
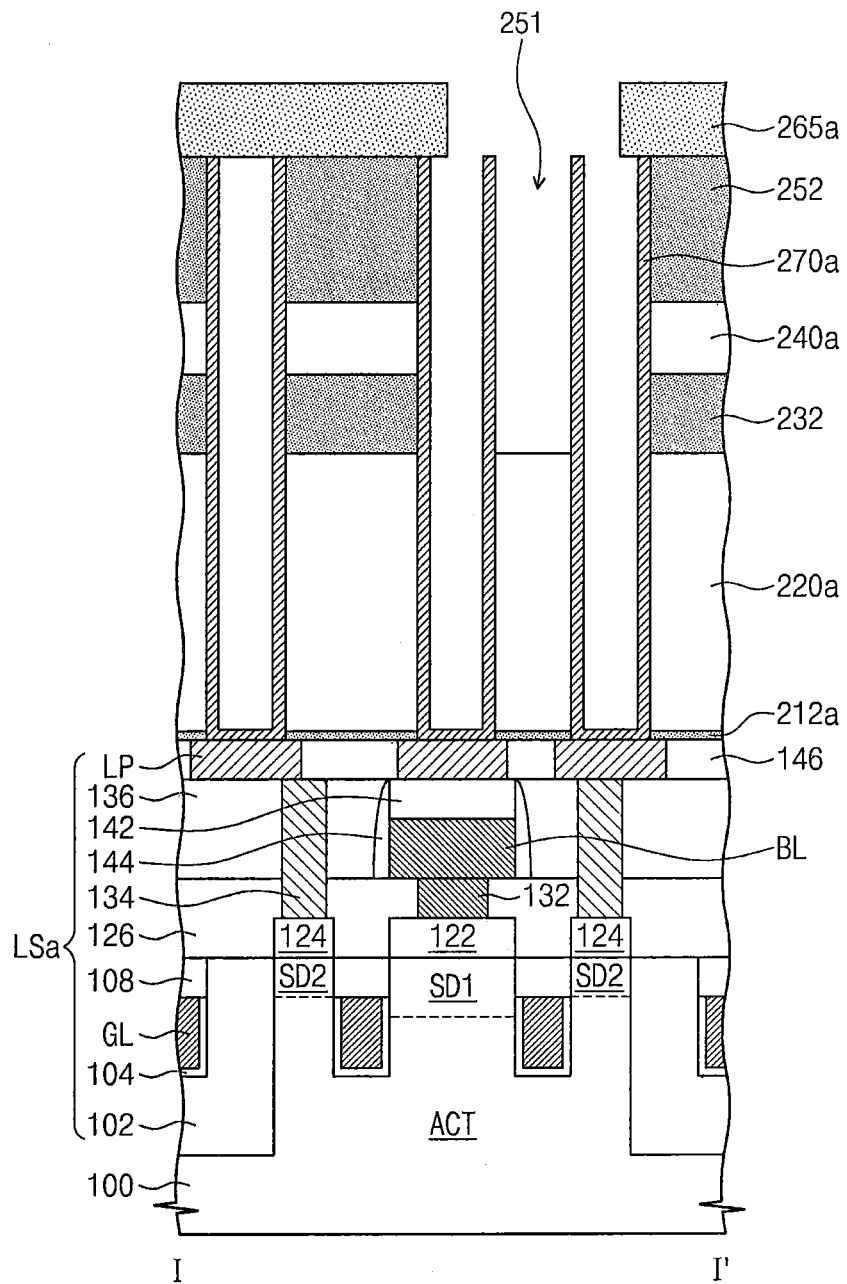
Figure 18B:
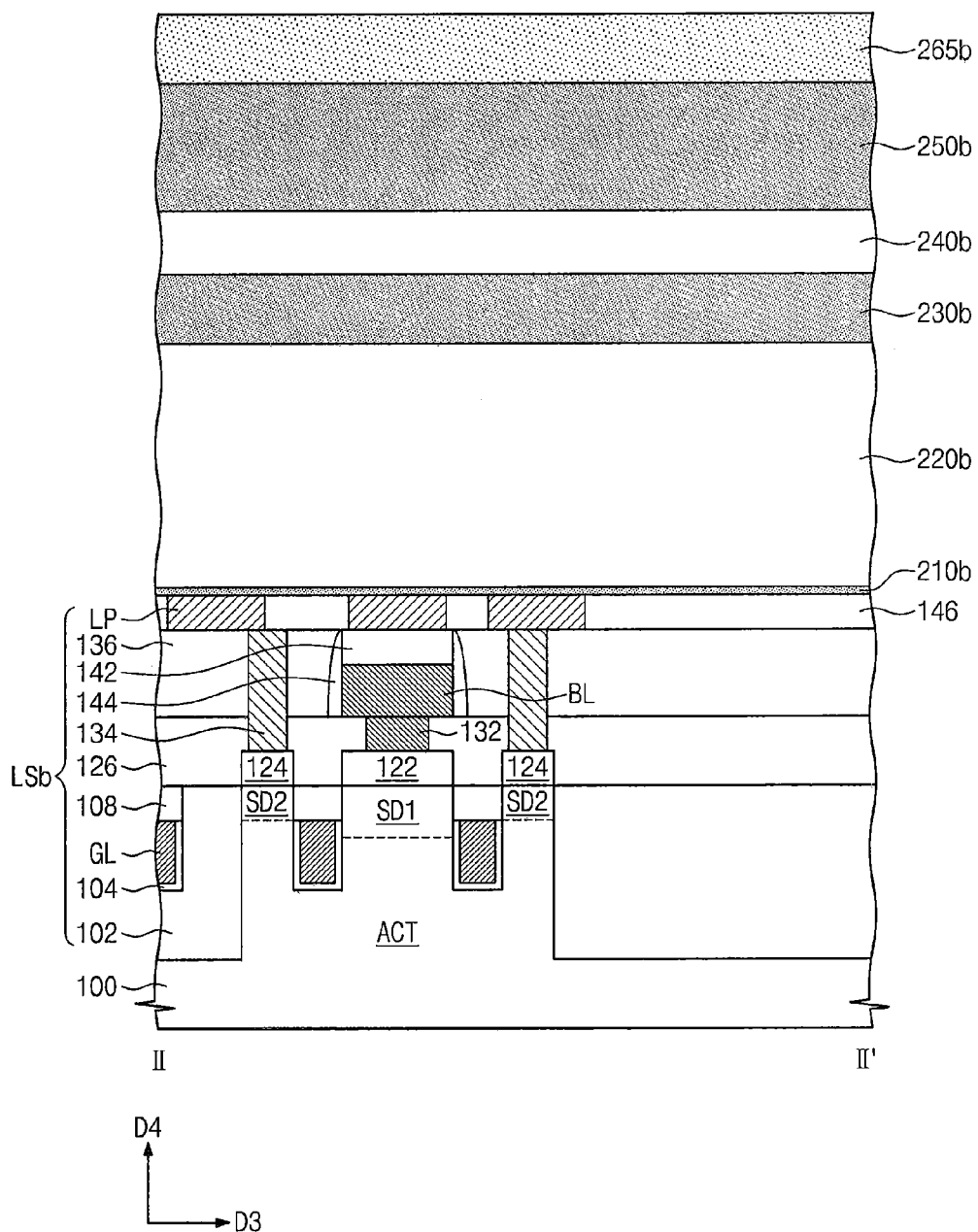

FIGS. 15A and 17A are plan views illustrating methods for manufacturing a semiconductor device on a first chip region, according to some embodiments of the inventive concepts. FIGS. 15B and 17B are plan views illustrating methods for manufacturing a semiconductor device on a second chip region, according to some embodiments of the inventive concepts. FIGS. 16A and 18A are cross-sectional views taken along lines I-I' of 15A and 17A, respectively. FIGS. 16B and 18B are cross-sectional views taken along lines of 15B and 17B, respectively. In the present embodiment, the descriptions to the same technical features as in the embodiment of FIGS. 4A to 12A and 4B to 12B will be omitted or mentioned briefly for the purpose of ease and convenience in explanation. In other words, differences between the present embodiment and the embodiment of FIGS. 4A to 12A and 4B to 12B will be mainly described hereinafter.

Referring to FIGS. 15A, 15B, 16A, and 16B, a first mask pattern 260a and a second mask pattern 260b may be formed on the resultant structure of FIGS. 4A, 4B, 5A, and 5B. The first mask pattern 260a may be the same as described with reference to FIGS. 4A and 5A. However, the second mask pattern 260b may not include an opening but may completely cover the top surface of the second upper support layer 250b. Thus, the first lower electrode holes Ha (see FIGS. 8A and 9A) may be formed on the first chip region ND, but second lower electrode holes Hb may not be formed on the second chip region UD. This may be because the second mask pattern 260b may protect the second upper support layer 250b from the etching process of forming the lower electrode holes.

Referring to FIGS. 17A, 17B, 18A, and 18B, the first lower electrodes 270a may be formed in the first lower electrode holes Ha, respectively. At this time, lower electrodes may not be formed on the second chip region UD.

Next, a third mask pattern 265a and a fourth mask pattern 265b may be formed on the first and second upper support layers 250a and 250b, respectively. The third and fourth mask patterns 265a and 265b may be the same as described with reference to FIGS. 10A, 10B, 11A, and 11B.

Subsequently, the first upper and lower support layers 250a and 230a may be sequentially patterned using the third mask pattern 265a as an etch mask to form lower and upper support patterns 232 and 252. However, the second upper and lower support layers 250b and 230b of the second chip region UD may be protected by the fourth mask pattern 265b.

Referring again to FIGS. 13A, 13B, 14A, and 14B, the first lower and upper mold layers 220a and 240a may be completely removed. At the same time, lower and upper recess regions 225 and 245 may be formed in the second lower and upper mold layers 220b and 240b, respectively. Next, the first and second dielectric layers 280a and 280b and the first and second upper electrodes 290a and 290b may be sequentially formed.

According to the present embodiment, the second upper support layer 250b disposed at the same level as the upper support pattern 252 may remain on the second chip region UD. Thus, a height difference between the first and second chip regions ND and UD may not occur. In addition, the second mask pattern 260b may prevent a lower electrode from being formed on the second chip region UD. Thus, it is possible to prevent process defects caused by a lower electrode from occurring on the second chip region UD.

According to some embodiments of the inventive concepts, it is possible to reduce or prevent the height difference, which may occur on the edge of the wafer. In addition, it is possible to reduce or prevent the process defects which may occur on the edge of the wafer. As a result, defects which may occur in the capacitor formation processes and subsequent processes may be reduced or prevented to improve a yield of semiconductor devices.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for manufacturing a semiconductor device, the method comprising:
    forming a first lower structure and a second lower structure on a first chip region and a second chip region of a substrate, respectively, wherein the second chip region is on an edge of the substrate and the first and second lower structures including selection elements;
    forming a first mold layer and a second mold layer on the first lower structure and the second lower structure, respectively;
    forming a first support layer and a second support layer on the first mold layer and the second mold layer, respectively;
    patterning the first support layer and the first mold layer to form a plurality of first holes exposing the first lower structure;
    forming first lower electrodes in the first holes, respectively;
    forming a support pattern including at least one opening by selectively patterning the first support layer while leaving the second support layer; and
    removing the first mold layer through the at least one opening,
    wherein a top surface of the support pattern is disposed at a substantially same level as a top surface of the second support layer.

2. The method of claim 1, further comprising forming a recess region in the second mold layer when the first mold layer is removed.

3. The method of claim 2, further comprising:
    forming a dielectric layer covering surfaces of the first lower electrodes and a top surface of the second support layer; and
    forming an upper electrode on the dielectric layer.

4. The method of claim 3, wherein the dielectric layer and the upper electrode are sequentially formed in the recess region to fill the recess region.

5. The method of claim 1, wherein the forming of the support pattern comprises:
    forming a first mask pattern and a second mask pattern on the first support layer and the second support layer, respectively, the second mask pattern completely covering a top surface of the second support layer; and
    patterning the first support layer using the first mask pattern as an etch mask,
    wherein the second support layer is protected by the second mask pattern when the first support layer is patterned.

6. The method of claim 1, wherein the first and second mold layers are formed at the same time, and
    wherein the first and second support layers are formed at the same time.

7. The method of claim 1, further comprising:
    patterning the second support layer and the second mold layer to form a plurality of second holes on the second chip region; and
    forming second lower electrodes in the second holes, respectively,
    wherein the second holes are formed simultaneously with the first holes, and
    wherein the second lower electrodes are formed simultaneously with the first lower electrodes.

8. The method of claim 7, wherein a bottom surface of at least one of the second holes is vertically spaced apart from a top end of the second lower structure.

9. The method of claim 1, wherein the forming of each of the first and second lower structures comprises:
    forming a device isolation layer in the substrate to define an active region;
    forming a gate line intersecting the active region; and
    forming a first dopant region and a second dopant region in the active region at both sides of the gate line, respectively.

10. The method of claim 9, wherein the forming of each of the first and second lower structures further comprises: forming a bit line electrically connected to the first dopant region, and
   wherein the bit line intersects the gate line when viewed from a plan view.

11. The method of claim 9, wherein the forming of each of the first and second lower structures further comprises:
   forming a buried contact electrically connected to the second dopant region; and
   forming a landing pad on the buried contact,
   wherein at least one of the first holes exposes the landing pad.

12. A method for manufacturing a semiconductor device, the method comprising:
   forming transistors on each of a first chip region and a second chip region of a substrate;
   forming a first mold layer and a second mold layer on the first chip region and the second chip region, respectively;
   forming a first support layer and a second support layer on the first mold layer and the second mold layer, respectively;
   forming first lower electrodes that penetrate the first support layer and the first mold layer so as to be electrically connected to the transistors of the first chip region; and
   selectively removing the first mold layer while leaving the second mold layer,
   wherein a recess region is formed in the second mold layer when the first mold layer is removed.

13. The method of claim 12, wherein the second chip region is disposed on an edge of the substrate.

14. The method of claim 12, further comprising:
   forming a support pattern including at least one opening by selectively patterning the first support layer while leaving the second support layer,
   wherein a top surface of the support pattern is disposed at a substantially same level as a top surface of the second support layer, and
   wherein the first mold layer is isotropically removed by an etching solution provided through the at least one opening.

15. A method for manufacturing a semiconductor device, the method comprising:
   forming, sequentially, a first mold layer and a first support layer on a first lower structure in a first chip region of a substrate, the first mold layer and the first support layer including a plurality of holes exposing the first structure;
   forming a second mold layer on a second lower structure in a second chip region of the substrate, wherein the first and second lower structures include selection elements, and wherein the second chip region is on an edge of the substrate;
   forming a second support layer on the second mold layer;
   forming first lower electrodes in the plurality of holes, respectively;
   forming a support pattern including at least one opening by selectively patterning a first support layer, wherein a top surface of the support pattern is at substantially a same level as a top surface of the second support layer; and
   removing the first mold layer through the at least one opening.

16. The method of claim 15, further comprising:
forming a recess region in the second mold layer when the first mold layer is removed;
   forming a dielectric layer that covers surfaces of the first lower electrodes; and
   forming an upper electrode on the dielectric layer,
   wherein the dielectric layer and the upper electrode are sequentially formed in the recess region to fill the recess region.

17. The method of claim 15, further comprising forming each of the first and second lower structures, wherein forming each of the first and second lower structures comprises:
   forming a device isolation layer in the substrate to define an active region;
   forming a gate line intersecting the active region; and
   forming a first dopant region and a second dopant region in the active region at both sides of the gate line, respectively.

* * * * *